US007923192B2

(12) United States Patent
Hirayama et al.

(10) Patent No.: US 7,923,192 B2
(45) Date of Patent: *Apr. 12, 2011

(54) BASE MATERIAL FOR PATTERN-FORMING MATERIAL, POSITIVE RESIST COMPOSITION AND METHOD OF RESIST PATTERN FORMATION

(75) Inventors: Taku Hirayama, Kawasaki (JP); Daiju Shiono, Kawasaki (JP); Tasuku Matsumiya, Kawasaki (JP); Yohei Kinoshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 43 days.

This patent is subject to a terminal disclaimer.

(21) Appl. No.: 10/590,046

(22) PCT Filed: Feb. 8, 2005

(86) PCT No.: PCT/JP2005/001798
§ 371 (c)(1),
(2), (4) Date: Jun. 15, 2007

(87) PCT Pub. No.: WO2005/081062
PCT Pub. Date: Sep. 1, 2005

(65) Prior Publication Data
US 2007/0281243 A1 Dec. 6, 2007

(30) Foreign Application Priority Data

Feb. 20, 2004 (JP) .............................. P2004-045043
Feb. 20, 2004 (JP) .............................. P2004-045044
Jun. 21, 2004 (JP) .............................. P2004-182300
Jun. 21, 2004 (JP) .............................. P2004-182301

(51) Int. Cl.
*G03C 1/00* (2006.01)
*G03F 7/00* (2006.01)
*G03F 1/00* (2006.01)
(52) U.S. Cl. .................. 430/270.1; 430/311; 430/322
(58) Field of Classification Search .............. 430/270.1
See application file for complete search history.

(56) References Cited

U.S. PATENT DOCUMENTS

| 5,658,706 | A | | 8/1997 | Niki et al. | |
|---|---|---|---|---|---|
| 5,693,452 | A | | 12/1997 | Aoai et al. | |
| 5,707,776 | A | * | 1/1998 | Kawabe et al. | 430/270.1 |
| 5,824,451 | A | | 10/1998 | Aoai et al. | |
| 5,837,420 | A | * | 11/1998 | Aoai et al. | 430/270.1 |
| 5,844,057 | A | | 12/1998 | Watanabe et al. | |
| 5,994,025 | A | | 11/1999 | Iwasa et al. | |
| 6,037,098 | A | | 3/2000 | Aoai et al. | |
| 6,106,993 | A | | 8/2000 | Watanabe et al. | |
| 6,197,473 | B1 | | 3/2001 | Kihara et al. | |
| 6,638,683 | B1 | * | 10/2003 | Tan et al. | 430/270.1 |
| 7,220,808 | B2 | | 5/2007 | Yamagishi et al. | |
| 7,504,196 | B2 | | 3/2009 | Shiono et al. | |
| 2002/0025495 | A1 | | 2/2002 | Ogata et al. | |
| 2002/0058205 | A1 | | 5/2002 | Nakashima et al. | |
| 2003/0232277 | A1 | | 12/2003 | Sasaki et al. | |
| 2004/0005512 | A1 | | 1/2004 | Mizutani et al. | |
| 2004/0234885 | A1 | | 11/2004 | Watanabe et al. | |
| 2005/0271971 | A1 | | 12/2005 | Ueda et al. | |
| 2007/0259273 | A1 | | 11/2007 | Shiono et al. | |
| 2007/0281243 | A1 | | 12/2007 | Hirayama | |
| 2008/0020288 | A1 | * | 1/2008 | Hirayama et al. | 430/4 |
| 2008/0145784 | A1 | | 6/2008 | Shiono et al. | |
| 2009/0162781 | A1 | | 6/2009 | Shiono et al. | |

FOREIGN PATENT DOCUMENTS

| JP | 05-061197 | 3/1993 |
|---|---|---|
| JP | H5-249681 | 9/1993 |
| JP | H06-059444 | 3/1994 |
| JP | 06-167811 | 6/1994 |
| JP | H06-266109 | 9/1994 |
| JP | 08-193054 | 7/1996 |
| JP | H08-220740 | 8/1996 |
| JP | H08-262712 | 10/1996 |
| JP | H08-337616 | 12/1996 |
| JP | H8-337616 | 12/1996 |
| JP | 09-005999 | 1/1997 |
| JP | H9-160246 | 6/1997 |

(Continued)

OTHER PUBLICATIONS

JP 2001-312055 English Translation.*
Hirayama et al., "Development of Amorphous Polyphenol Resists with Low Molecular Weight and Narrow Dispersion for EB Lithography", IEEE Xplore, pp. 10-11, Oct. 22, 2004.*
Office Action and Search Report issued on May 12, 2008, on the counterpart Taiwanese Patent Application No. 094104523.
Yamaguchi et al., *Linewidth fluctuations caused by polymer aggregates in resist films*, Journal of Photopolymer Science and Technology, vol. 10 No. 4, pp. 635-640, (1997).

(Continued)

*Primary Examiner* — Cynthia H Kelly
*Assistant Examiner* — Connie P Johnson
(74) *Attorney, Agent, or Firm* — Knobbe, Martens, Olson & Bear LLP

(57) ABSTRACT

A base material for a pattern-forming material, a positive resist composition, and a method of resist pattern formation that are capable of forming a high resolution pattern with reduced levels of LER. The base material includes a low molecular weight compound (X1), which is formed from a polyhydric phenol compound (x) that contains two or more phenolic hydroxyl groups and satisfies the conditions (1), (2), and (3) described below, wherein either a portion of, or all of, the phenolic hydroxyl groups are protected with acid dissociable, dissolution inhibiting groups: (1) a molecular weight within a range from 300 to 2,500, (2) a molecular weight dispersity of no more than 1.5, and (3) an ability to form an amorphous film using a spin coating method. Alternatively, the base material includes a protected material (Y1), which is formed from a polyhydric phenol compound (y) that contains two or more phenolic hydroxyl groups and has a molecular weight within a range from 300 to 2,500, in which a predetermined proportion of the phenolic hydroxyl groups are protected with acid dissociable, dissolution inhibiting groups.

20 Claims, No Drawings

FOREIGN PATENT DOCUMENTS

| | | |
|---|---|---|
| JP | H09-211866 | 8/1997 |
| JP | H10-123703 | 5/1998 |
| JP | H10-274845 | 10/1998 |
| JP | A-11-153863 | 6/1999 |
| JP | H11-167199 | 6/1999 |
| JP | H11-199533 | 7/1999 |
| JP | 2000-086584 | 3/2000 |
| JP | 2000-305270 | 11/2000 |
| JP | 2000-330282 | 11/2000 |
| JP | 2001312055 A * | 11/2001 |
| JP | 2002-055452 | 2/2002 |
| JP | 2002-099088 | 4/2002 |
| JP | 2002-099089 | 4/2002 |
| JP | 2002-221787 | 8/2002 |
| JP | A-2002-328473 | 11/2002 |
| JP | 2003-030282 | 1/2003 |
| JP | A-2003-084437 | 3/2003 |
| JP | 2003-183227 | 7/2003 |
| JP | 2003-260881 | 9/2003 |
| JP | 2004-062049 | 2/2004 |
| JP | 2004-125835 | 4/2004 |
| JP | 2004-151605 | 5/2004 |
| JP | A-2004-191913 | 7/2004 |
| JP | 2004-302440 | 10/2004 |
| JP | 2004-359590 | 12/2004 |
| JP | 205-091909 | 4/2005 |
| JP | 2005-089387 | 4/2005 |
| JP | 2005-309421 | 11/2005 |
| KR | 0231242 | 5/1997 |
| KR | 2001-0088341 | 9/2001 |
| KR | 406242 | 11/2003 |
| TW | 200302397 A | 8/2003 |
| TW | 200617602 | 6/2006 |
| WO | WO 2006/046383 | 5/2006 |

OTHER PUBLICATIONS

Office Action issued on May 27, 2008, on the counterpart Japanese Application No. 2004-182300.
Office Action issued on Jun. 3, 2008, on the counterpart Japanese Application No. 2004-182301.
Office Action issued on Aug. 26, 2008, on the counterpart Japanese Patent Application No. 2004-182301.
Office Action issued in corresponding Japanese Patent Application No. 2004-260764, dated Mar. 3, 2009.
Hirayama et al. "Development of Electron Beam Resists Based on Amorphous Polyphenols with Low Molecular Weight and Narrow Dispersion" Proceedings of SPIE vol. 5753, p. 738-745.
Hirayama et al., Journal of Photopolymer Science and Technology, vol. 17, No. 3, 435-440, (2004).
Hirayama, T., et al. "Depth Profile and Line-Edge Roughness of Low-Molecular-Weight Amorphous Electron Beam Resists", The Japan Journal of Applied Physics, vol. 44, No. 7B, 2005, pp. 5484-5488.
International Search Report dated Sep. 6, 2005 for PCT/JP2005/013564.
International Search Report from PCT/JP2005/018143 dated Nov. 15, 2005.
International Search Report from PCT/JP2006/302271, mailed on Mar. 7, 2006.
International Search Report in connection with corresponding PCT application No. PCT/JP2006/313103, dated Sep. 26, 2006.
International Search Report issued in corresponding PCT Application No. PCT/JP2006/311443, dated Jun. 7, 2006.
International Search Report, PCT/JP2006/301679, Feb. 16, 2006.
Office Action issued Sep. 16, 2008 on the counterpart Korean Patent Application No. 10-2007-7010473.
Notice of Allowance issued on related Korean Patent Application No. 10-2009-7006750, dated Feb. 16, 2010.
Office Action issued in counterpart Japanese Patent Application No. 2005-026266, dated Mar. 3, 2009.
Office Action issued in counterpart Japanese Patent Application No. JP 2005-050721, dated Jul. 28, 2009.
Office Action issued in counterpart Japanese Patent Application No. JP 2005-050721, dated Mar. 3, 2009.
Office Action issued in counterpart Korean Patent Application No. 10-2007-7017441, dated May 7, 2009.
Office Action issued in Korean Patent Application No. 10-2007-7004390, dated Dec. 17, 2008.
Office Action issued in Korean Patent Application No. 10-2008-7025851, dated Jan. 7, 2009.
Office Action issued on Apr. 14, 2008 on the counterpart Korean Patent Application No. 10-2007-7004390.
Office Action issued on the counterpart Korean Patent Application No. 10-2007-7019433, dated Jun. 5, 2008.
Hirayama et al, "Development of Amorphous PolyPhenol Resists with Low Molecular Weight and Narrow Dispersion for EB Lithography", IEEE Xplore, Oct. 22, 2004, pp. 10-11.
Notice of Allowance issued on corresponding Japanese Patent Application No. 2004-260764, dated Feb. 16, 2010.
Decision to Grant a Patent issued in corresponding Japanese Patent Application No. 2004-182301, dated Jan. 6, 2009.
European Search Report issued in related European Patent Application No. EP 06732357.6, dated Aug. 30, 2010.
European Search Report issued in related European Patent Application No. EP 05788289.6, dated Jul. 26, 2010.

* cited by examiner

BASE MATERIAL FOR PATTERN-FORMING MATERIAL, POSITIVE RESIST COMPOSITION AND METHOD OF RESIST PATTERN FORMATION

RELATED APPLICATIONS

This application is the U.S. National Phase filing under 35 U.S.C. §371 of PCT/JP2005/001798, filed Feb. 8, 2005, which designated the United States and was published in a language other than English, which claims priority under 35 U.S.C. §119(a)-(d) to Japanese Patent Application Nos. 2004-045043, filed Feb. 20, 2004; 2004-045044, filed Feb. 20, 2004; 2004-182300, filed Jun. 21, 2004; and 2004-182301, filed Jun. 21, 2004. The content of these applications is incorporated herein by reference in their entireties.

TECHNICAL FIELD

The present invention relates to base material for a pattern-forming material, a positive resist composition, and a method of resist pattern formation.

BACKGROUND ART

In recent years, in the production of semiconductor elements and liquid crystal display elements, advances in lithography techniques have lead to rapid progress in the field of pattern miniaturization. Typically, these miniaturization techniques involve shortening the wavelength of the exposure light source. Conventionally, ultraviolet radiation such as g-line and i-line radiation has been used, but nowadays, mass production of semiconductor elements using KrF excimer lasers and ArF excimer lasers has already commenced. Investigations are also being conducted into the use of even shorter wavelength sources than the above excimer lasers, including $F_2$ excimer lasers, electron beams, extreme ultraviolet radiation, and X-rays.

Furthermore, one example of a pattern-forming material capable of forming a pattern of minute dimensions is a chemically amplified resist, which includes a base material component with a film-forming capability, and an acid generator component that generates acid on exposure. Chemically amplified resists include negative compositions, which undergo a reduction in alkali solubility on exposure, and positive compositions, which display increased alkali solubility on exposure.

Conventionally, the most common base material components used within pattern-forming materials such as resists are polymers with a weight average molecular weight of at least 5,000.

In this description, the term "base material for pattern formation" refers to the main material responsible for forming a pattern structure.

However, when a pattern is formed using this type of pattern-forming material, a problem arises in that roughness can develop on the upper surface and side wall surfaces of the pattern.

This type of roughness has conventionally posed few problems. However in recent years, with the rapid miniaturization of semiconductor elements and the like, ever higher levels of resolution such as width dimensions of no more than 90 nm are being demanded, and this miniaturization has meant that roughness is becoming a more serious problem. For example, when a line pattern is formed, roughness on the side wall surfaces of the pattern known as LER (line edge roughness) causes fluctuation in the line width that is formed, and although the degree of this fluctuation in the line width is preferably suppressed to no more than approximately 10% of the width dimension, the effects of LER increase as the pattern dimensions are reduced. For example, when a line pattern with dimensions of approximately 90 nm is formed, the degree of the fluctuation in the line width is preferably suppressed to no more than approximately 10 nm.

However, the polymers typically used as base materials have a large root mean squared radius per molecule of several nm, meaning the degree of fluctuation described above is equivalent to the width of only a few polymer molecules. As a result, as long as polymers are used as the base material component, reductions in LER will remain extremely difficult to achieve.

On the other hand, the use of low molecular weight materials containing alkali-soluble groups such as hydroxyl groups, wherein either a portion of, or all of, the hydroxyl groups are protected with acid dissociable, dissolution inhibiting groups, as the base material has also been proposed (for example, see patent references 1 and 2). These low molecular weight materials have small root mean squared radius values as a result of their lower molecular weight, and as such, their contribution to LER is expected to be minimal.

[Patent Reference 1]
Japanese Unexamined Patent Application, First Publication No. 2002-099088

[Patent Reference 2]
Japanese Unexamined Patent Application, First Publication No. 2002-099089

DISCLOSURE OF INVENTION

Problems to be Solved by the Invention

However, even when these low molecular weight materials are used, satisfactory improvement in the level of LER is still difficult to achieve, and further improvements in the level of LER are still sought.

The present invention takes the above circumstances into consideration, with an object of providing a base material for a pattern-forming material, a positive resist composition, and a method of resist pattern formation that are capable of forming a high resolution pattern with reduced levels of LER.

Means for Solving the Problems

As a result of intensive investigation, the inventors of the present invention discovered that the above object could be achieved by using a low molecular weight compound formed from a polyhydric phenol compound that has a specific molecular weight and specific molecular weight dispersity and is capable of forming an amorphous film using spin coating, wherein the phenolic hydroxyl groups are protected with acid dissociable, dissolution inhibiting groups, and they were thus able to complete the present invention.

In other words, a first aspect of the present invention is a base material for a pattern-forming material that includes a low molecular weight compound (X1), which is formed from a polyhydric phenol compound (x) that contains two or more phenolic hydroxyl groups and satisfies the conditions (1), (2), and (3) described below, wherein either a portion of, or all of, the phenolic hydroxyl groups are protected with acid dissociable, dissolution inhibiting groups.

(1) A molecular weight within a range from 300 to 2,500, (2) a molecular weight dispersity of no more than 1.5, and (3) an ability to form an amorphous film using a spin coating method.

Furthermore, when the inventors of the present invention undertook further investigation focused on the base material for a pattern-forming material containing a protected material in which the phenolic hydroxyl groups of a polyhydric phenol compound with a specific low molecular weight are protected with acid dissociable, dissolution inhibiting groups, they discovered that the object above could be achieved by ensuring that the proportion of unprotected material, in which none of the hydroxyl groups of the polyhydric phenol compound are protected with acid dissociable, dissolution inhibiting groups, is suppressed to no more than a specific value, and they were thus able to complete the present invention.

In other words, a second aspect of the present invention is a base material for a pattern-forming material that includes a protected material (Y1), which is formed from a polyhydric phenol compound (y) that contains two or more phenolic hydroxyl groups and has a molecular weight within a range from 300 to 2,500, in which either a portion of, or all of, the phenolic hydroxyl groups are protected with acid dissociable, dissolution inhibiting groups, wherein the proportion within the base material of an unprotected material (Y2), in which the phenolic hydroxyl groups of the polyhydric phenol compound (y) are not protected with acid dissociable, dissolution inhibiting groups, is no more than 60% by weight.

Furthermore, a third aspect of the present invention is a positive resist composition that includes a base material component (A), which contains acid dissociable, dissolution inhibiting groups and displays increased alkali solubility under the action of acid, and (B) an acid generator that generates acid on exposure, wherein the base material component (A) is the base material for a pattern-forming material according to either of the above first and second aspects.

Furthermore, a fourth aspect of the present invention is a method of forming a resist pattern that includes the steps of applying the positive resist composition according to the third aspect to a substrate, conducting a prebake, performing selective exposure, conducting PEB (post exposure baking), and performing alkali developing to form the resist pattern.

In this description, the term "exposure" refers to irradiation with some form of radiation, or direct patterning or irradiation with an electron beam.

Effects of the Invention

A base material for a pattern-forming material, a positive resist composition, and a method of forming a resist pattern according to the present invention enable the formation of a high resolution pattern with a reduced level of LER.

Best Mode for Carrying Out the Invention

As follows is a more detailed description of the present invention.
<Base Material for Pattern-Forming Material>

A base material for a pattern-forming material according to the first aspect of the present invention includes a low molecular weight compound (X1) formed from a polyhydric phenol compound (x) that contains two or more phenolic hydroxyl groups and satisfies the above conditions (1) through (3), wherein either a portion of, or all of, the phenolic hydroxyl groups are protected with acid dissociable, dissolution inhibiting groups.
<Polyhydric Phenol Compound (x)>

There are no particular restrictions on the polyhydric phenol compound (x) used in the formation of the low molecular weight compound (X1), provided the compound contains two or more phenolic hydroxyl groups, has a molecular weight within a range from 300 to 2,500, has a molecular weight dispersity of no more than 1.5, and is capable of forming an amorphous film using a spin coating method, and examples of suitable compounds include the polyhydric phenol compounds known as sensitizers or heat resistance improvement agents for non-chemically amplified g-line or i-line resists. Specific examples of these polyhydric phenols include the compounds listed below:

bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, bis(4-hydroxy-3,5-dimethylphenyl)-2-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(4-hydroxy-3-methylphenyl)-2-hydroxyphenylmethane, bis(3-cyclohexyl-4-hydroxy-6-methylphenyl)-2-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(4-hydroxy-3,5-dimethylphenyl)-2-hydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, 1-[1-(4-hydroxyphenyl)isopropyl]-4-[1,1-bis(4-hydroxyphenyl)ethyl]benzene, and four-benzene ring compounds of formalin condensation products of phenols such as phenol, m-cresol, p-cresol and xylenol.

In particular, the polyhydric phenol compound (x) is preferably one or more compounds selected from the group consisting of polyhydric phenol compounds represented by the general formulas (I), (II), and (III) shown below, as such compounds enable the formation of an amorphous film by spin coating, and exhibit excellent manifestation of the effects of the present invention.

[Formula 1]

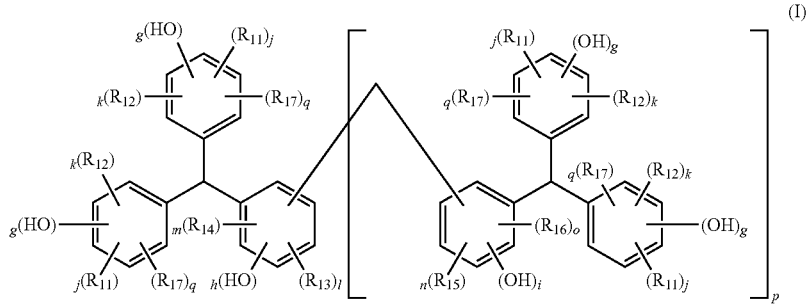

[Formula 2]

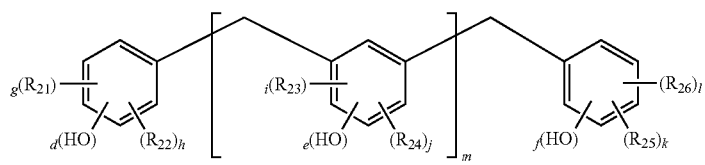

(II)

[Formula 3]

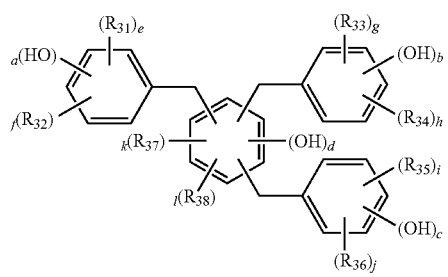

(III)

In the above general formula (I), $R_{11}$ through $R_{17}$ each represent, independently, an alkyl group or aromatic hydrocarbon group of 1 to 10 carbon atoms, and these structures may also include a hetero atom. The groups $R_{11}$ through $R_{17}$ preferably each represent, independently, a straight-chain or branched lower alkyl group of 1 to 10 carbon atoms, and even more preferably 1 to 5 carbon atoms, a cyclic alkyl group of 5 to 6 carbon atoms, or an aromatic hydrocarbon group of 6 to 10 carbon atoms. These alkyl groups or aromatic hydrocarbon groups may include a hetero atom such as an oxygen atom, nitrogen atom, or sulfur atom within the structure. Specific examples of suitable aromatic hydrocarbon groups include a phenyl group, tolyl group, xylyl group, mesityl group, phenethyl group, or naphthyl group.

g and j each represent, independently, an integer of 1 or greater, and preferably an integer from 1 to 2, k and q each represent, independently, either 0 or an integer of 1 or greater, and preferably an integer that does not exceed 2, and g+j+k+q is no greater than 5.

h is an integer of 1 or greater, and preferably from 1 to 2, l and m each represent, independently, either 0 or an integer of 1 or greater, and preferably an integer that does not exceed 2, and h+l+m is no greater than 4.

i is an integer of 1 or greater, and preferably from 1 to 2, n and o each represent, independently, either 0 or an integer of 1 or greater, and preferably an integer that does not exceed 2, and i+n+o is no greater than 4.

p is either 0 or 1, and is preferably 1.

Of these possibilities, compounds in which $R_{11}$ is a cycloalkyl group, j is 1, $R_{12}$ is a lower alkyl group, and preferably a lower alkyl group of 1 to 5 carbon atoms, k is 1, and g is 1 are preferred.

In addition, compounds in which $R_{11}$ is a cycloalkyl group, j is 1, $R_{12}$ is a lower alkyl group, k is 1, and g is 1, and moreover, q, l, m, n and o are zero, and h and i are both 1 enable the formation of a fine pattern with reduced LER and a high level of resolution, and are consequently preferred.

Of the polyhydric phenol compounds represented by the above general formula (I), the most preferred compounds are the polyhydric phenol compounds represented by formulas (I-1) and (I-2) shown below. The reason for this preference is that these polyhydric phenol compounds enable ready formation of an amorphous film.

[Formula 4]

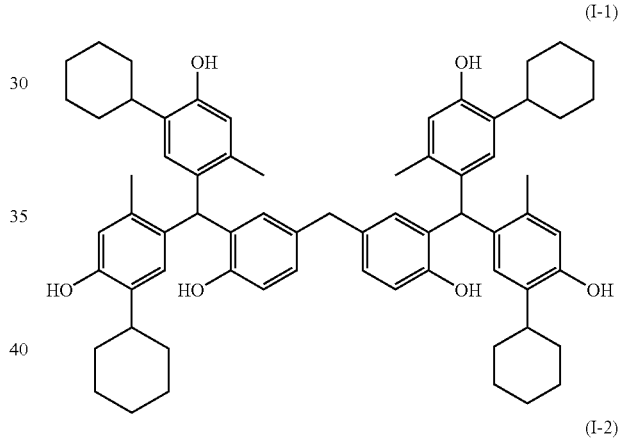

(I-1)

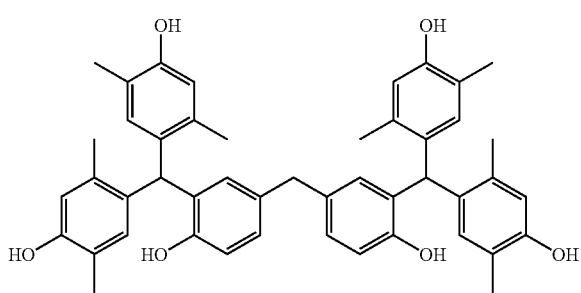

(I-2)

In the above general formula (II), $R_{21}$ through $R_{26}$ each represent, independently, an alkyl group or aromatic hydrocarbon group of 1 to 10 carbon atoms, and these structures may also include a hetero atom. The groups $R_{21}$ through $R_{26}$ preferably each represent, independently, a straight-chain, branched, or cyclic lower alkyl group of 1 to 10 carbon atoms, and even more preferably 1 to 5 carbon atoms, a cyclic alkyl group of 5 to 6 carbon atoms, or an aromatic hydrocarbon group of 6 to 10 carbon atoms. These alkyl groups or aromatic hydrocarbon groups may include a hetero atom such as an oxygen atom, nitrogen atom, or sulfur atom within the structure. Specific examples of suitable aromatic hydrocarbon groups include a phenyl group, tolyl group, xylyl group, mesityl group, phenethyl group, or naphthyl group. Of these possibilities, cases in which $R_{21}$ through $R_{26}$ are all lower alkyl groups are preferred. Compounds in which these lower alkyl groups contain from 1 to 5 carbon atoms are even more desirable.

d and g each represent, independently, an integer of 1 or greater, and preferably an integer from 1 to 2, h represents either 0 or an integer of 1 or greater, and preferably an integer that does not exceed 2, and d+g+h is no greater than 5.

e and i each represent, independently, an integer of 1 or greater, and preferably an integer from 1 to 2, j represents either 0 or an integer of 1 or greater, and preferably an integer that does not exceed 2, and e+i+j is no greater than 4.

f and k each represent, independently, an integer of 1 or greater, and preferably an integer from 1 to 2, l represents either 0 or an integer of 1 or greater, and preferably an integer that does not exceed 2, and f+k+l is no greater than 5.

m is an integer from 1 to 20, and preferably from 2 to 10.

In the above general formula (III), $R_{31}$ through $R_{38}$ each represent, independently, an alkyl group or aromatic hydrocarbon group of 1 to 10 carbon atoms, and these structures may also include a hetero atom. The groups $R_{31}$ through $R_{38}$ preferably each represent, independently, a straight-chain or branched lower alkyl group of 1 to 10 carbon atoms, and even more preferably 1 to 5 carbon atoms, a cyclic alkyl group of 5 to 6 carbon atoms, or an aromatic hydrocarbon group of 6 to 10 carbon atoms. These alkyl groups or aromatic hydrocarbon groups may include a hetero atom such as an oxygen atom, nitrogen atom, or sulfur atom within the structure. Specific examples of suitable aromatic hydrocarbon groups include a phenyl group, tolyl group, xylyl group, mesityl group, phenethyl group, or naphthyl group. Of these possibilities, cases in which $R_{31}$ through $R_{38}$ are all lower alkyl groups are preferred. Compounds in which these lower alkyl groups contain from 1 to 5 carbon atoms are even more desirable.

a and e each represent, independently, an integer of 1 or greater, and preferably an integer from 1 to 2, f represents either 0 or an integer of 1 or greater, and preferably an integer that does not exceed 2, and a+e+f is no greater than 5.

b and h each represent, independently, an integer of 1 or greater, and preferably an integer from 1 to 2, g represents either 0 or an integer of 1 or greater, and preferably an integer that does not exceed 2, and b+h+g is no greater than 5.

c and i each represent, independently, an integer of 1 or greater, and preferably an integer from 1 to 2, j represents either 0 or an integer of 1 or greater, and preferably an integer that does not exceed 2, and c+i+j is no greater than 5.

d represents an integer of 1 or greater, and preferably an integer from 1 to 2, k and l each represent, independently, either 0 or an integer of 1 or greater, and preferably an integer that does not exceed 2, and d+k+l is no greater than 3.

In the present invention, the polyhydric phenol compound (x) must have a molecular weight within a range from 300 to 2,500, and this molecular weight is preferably from 450 to 1,500, and even more preferably from 500 to 1,200. By ensuring that the molecular weight is no higher than the above upper limit, an adequate LER reduction effect can be achieved. Furthermore, the resolution also improves. Furthermore, ensuring that the molecular weight is at least as large as the lower limit enables the formation of a resist pattern with a favorable profile shape.

Furthermore, in order to realize the effects of the present invention, the molecular weight dispersity (Mw/Mn) for the polyhydric phenol compound (x) must be no more than 1.5. It is thought that the reason for this requirement is that provided the polyhydric phenol compound (x) has a narrow molecular weight distribution in which the dispersity is no more than 1.5, then even if the polyhydric phenol material contains a plurality of low molecular weight compounds (X1) with differing quantities of phenolic hydroxyl groups protected with acid dissociable, dissolution inhibiting groups (different protection numbers), the alkali solubility of each of these low molecular weight compounds (X1) will be comparatively uniform. Smaller dispersity values are preferred, and the dispersity value is even more preferably no more than 1.4, and is most preferably 1.3 or smaller.

Dispersity values are usually used for polydisperse compounds such as polymers, but even for monodisperse compounds, the existence of impurities such as production by-products or residual starting materials can result in the appearance of an apparent molecular weight distribution when analysis is conducted using gel permeation chromatography (GPC) or the like. In other words, in the case of a monodisperse compound, a dispersity of 1 indicates a purity degree of 100%, and increasingly large dispersity values indicate large quantities of impurities.

In the present invention, the molecular weight dispersity is calculated for compounds that exhibit the above type of apparent molecular weight distribution by measuring the weight average molecular weight (Mw) and the number average molecular weight (Mn) using a typical method used for the measurement of these Mw and Mn values for a polymer, such as a GPC method, and then determining the Mw/Mn ratio.

The dispersity can be adjusted either by removing reaction by-products and impurities following synthesis of the polyhydric phenol compound (x) that represents the targeted product, or by using conventional methods such as molecular weight fractionation treatments to remove the unneeded molecular weight fractions.

Furthermore, the polyhydric phenol compound (x) must be a material capable of forming an amorphous (non-crystalline) film using a spin coating method.

In this description, an amorphous film refers to an optically transparent film that does not crystallize.

Spin coating is one of the most commonly used techniques for forming thin films, and a judgment as to whether or not a polyhydric phenol compound is capable of forming an amorphous film using spin coating is determined on the basis of whether or not a film formed by spin coating onto an 8-inch silicon wafer is transparent across the entire film surface. More specifically, judgment can be conducted, for example, in the manner described below.

First, the polyhydric phenol material is added to a solvent typically used as a resist solvent, such as a mixed solvent of ethyl lactate and propylene glycol monoethyl ether acetate in a ratio (weight ratio) of 40/60 (hereafter this solvent is abbreviated as EM), in sufficient quantity to generate a solution with a concentration of 14% by weight, dissolution is achieved by ultrasound treatment (dissolution treatment) using an ultrasound cleaning apparatus, and the resulting solution is then spin coated onto a wafer at 1,500 rpm and subjected to drying and baking (PAB: Post Applied Bake) at 110° C. for 90 seconds. A visual assessment as to whether the formed film is transparent is then used to confirm whether or not an amorphous film has been formed. A non-transparent, cloudy film is not an amorphous film.

In the present invention, the polyhydric phenol compound (x) preferably exhibits favorable stability for the amorphous film formed in the manner described above, and compounds for which the amorphous state is retained even after standing for 2 weeks at room temperature following the above PAB treatment are particularly desirable.

<Low Molecular Weight Compound (X1)>

The low molecular weight compound (X1) is a compound in which either a portion of, or all of, the phenolic hydroxyl groups of the aforementioned polyhydric phenol compound (x) have been protected by substitution with acid dissociable, dissolution inhibiting groups.

There are no particular restrictions on the acid dissociable, dissolution inhibiting groups, and any group can be selected from amongst the various acid dissociable, dissolution inhibiting groups proposed for use within the hydroxystyrene-based resins and (meth)acrylate-based resins and the like used within conventional KrF or ArF chemically amplified resist compositions.

Specific examples of suitable groups include chain-like alkoxyalkyl groups, tertiary alkyloxycarbonyl groups, tertiary alkyl groups, tertiary alkoxycarbonylalkyl groups, and cyclic ether groups.

Examples of suitable chain-like alkoxyalkyl groups include a 1-ethoxyethyl group, ethoxymethyl group, 1-methoxyethyl group, 1-methoxymethylethyl group, methoxymethyl group, 1-isopropoxyethyl group, 1-methoxypropyl group, 1-ethoxypropyl group, and 1-n-butoxyethyl group.

Examples of suitable tertiary alkyloxycarbonyl groups include a tert-butyloxycarbonyl group and tert-amyloxycarbonyl group.

Examples of suitable tertiary alkyl groups include chain-like tertiary alkyl groups such as a tert-butyl group and tert-amyl group, and tertiary alkyl groups that include an aliphatic polycyclic group such as a 2-methyladamantyl group and 2-ethyladamantyl group.

Examples of suitable tertiary alkoxycarbonylalkyl groups include a tert-butyloxycarbonylmethyl group and tert-amyloxycarbonylmethyl group.

Examples of suitable cyclic ether groups include a tetrahydropyranyl group and tetrahydrofuranyl group.

Of these groups, in terms of providing excellent resolution, enhancing the uniformity of the low molecular weight compound (X1), and improving the level of LER, a chain-like alkoxyalkyl group is preferred, and a 1-ethoxyethyl group or ethoxymethyl group is particularly desirable.

In those cases where the base material for a pattern-forming material contains a plurality of low molecular weight compounds (X1) (hereafter also referred to as isomers) with differing quantities of phenolic hydroxyl groups protected with acid dissociable, dissolution inhibiting groups (different protection numbers), materials in which the protection numbers for each isomer are close in value produce superior effects for the present invention, and are consequently preferred.

The proportion of the low molecular weight compound (X1) within the base material for the pattern-forming material is preferably greater than 40% by weight, even more preferably greater than 50% by weight, even more preferably greater than 80% by weight, and is most preferably 100% by weight.

<Unprotected Material (X2)>

In a base material for a pattern-forming material according to the present invention, the quantity of the aforementioned polyhydric phenol compound (x) in which none of the phenolic hydroxyl groups are protected by acid dissociable, dissolution inhibiting groups (hereafter also referred to as the unprotected material (X2)) is preferably kept as low as possible.

In the base material for a pattern-forming material according to the present invention, the proportion of this unprotected material (X2) is preferably no higher than 60% by weight. This proportion of the unprotected material (X2) is preferably as small as possible, and is even more preferably no higher than 50% by weight, even more preferably 10% by weight or less, and is most preferably 0% by weight. Provided the quantity of the unprotected material (X2) is no higher than 60% by weight, the level of LER can be further reduced during pattern formation. Moreover, the resolution is also superior.

The base material for a pattern-forming material can be produced, for example, by a method in which either all of, or a portion of, the phenolic hydroxyl groups of either one, or two or more polyhydric phenol compounds (x) are protected with acid dissociable, dissolution inhibiting groups using known techniques.

One method of ensuring that the proportion of unprotected material (X2) is no more than 60% by weight involves producing the base material by a method in which either all of, or a portion of, the phenolic hydroxyl groups of either one, or two or more polyhydric phenol compounds (x) are protected with acid dissociable, dissolution inhibiting groups using known techniques, and then either using gel permeation chromatography (GPC) to remove the unprotected material (X2), or protecting the unprotected material (X2) with the aforementioned acid dissociable, dissolution inhibiting groups.

Furthermore, in the low molecular weight compound (X1), the protection number for each of the isomers can be adjusted by a method that involves protection with the above acid dissociable, dissolution inhibiting groups.

In the base material for a pattern-forming material, the relative proportions of the low molecular weight compound (X1), each of the isomers of the low molecular weight compound (X1), and the unprotected material (X2) can be measured using a technique such as reverse phase chromatography.

Furthermore, from the viewpoints of resolution and the LER reduction effect, the phenolic hydroxyl group protection ratio within the base material for a pattern-forming material, that is, the proportion of phenolic hydroxyl groups that have been protected with acid dissociable, dissolution inhibiting groups relative to the combined total of phenolic hydroxyl groups that have been protected with acid dissociable, dissolution inhibiting groups and unprotected phenolic hydroxyl groups, is preferably within a range from 5 to 50 mol %, and even more preferably from 7 to 30 mol %.

A base material for a pattern-forming material according to the second aspect of the present invention is a base material for a pattern-forming material that includes a protected material (Y1), which is formed from a polyhydric phenol compound (y) that contains two or more phenolic hydroxyl groups and has a molecular weight within a range from 300 to 2,500, in which either a portion of, or all of, the phenolic hydroxyl groups are protected with acid dissociable, dissolution inhibiting groups, wherein the proportion within the base material of an unprotected material (Y2), in which the phenolic hydroxyl groups of the polyhydric phenol compound (y) are not protected with acid dissociable, dissolution inhibiting groups, is no more than 60% by weight.

In this description, the polyhydric phenol compound (y) refers to the compound prior to protection with the acid dissociable, dissolution inhibiting groups, the compound that has been protected with acid dissociable, dissolution inhibiting groups is referred to as the protected material (Y1), and the compound that has not been protected is referred to as the unprotected material (Y2), and the base material for a pattern-forming material according to the present invention includes the protected material (Y1) and must contain no more than 60% by weight of the unprotected material (Y2).

<Polyhydric Phenol Compound (y)>

There are no particular restrictions on the polyhydric phenol compound (y) that yields the protected material and unprotected material provided the compound contains two or more phenolic hydroxyl groups and has a molecular weight within a range from 300 to 2,500, and examples of suitable compounds include the polyhydric phenol compounds known as sensitizers or heat resistance improvement agents for non-chemically amplified g-line or i-line resists. Specific examples of these polyhydric phenols include the compounds listed below:

bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, bis(4-hydroxy-3,5-dimethylphenyl)-2-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(4-hydroxy-3-methylphenyl)-2-hydroxyphenylmethane, bis(3-cyclohexyl-4-hydroxy-6-methylphenyl)-2-hydroxyphenylmethane, bis(3-cyclohexyl-4-hydroxy-6-methylphenyl)-4-hydroxyphenylmethane,bis(3-cyclohexyl-4-hydroxy-6-methylphenyl)-3,4-dihydroxyphenylmethane, bis(4-hydroxy-3,5-dimethylphenyl)-2-hydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, 1-[1-(4-hydroxyphenyl)isopropyl]-4-[1,1-bis(4-hydroxyphenyl)ethyl]benzene, and four-benzene ring compounds of formalin condensation products of phenols such as phenol, m-cresol, p-cresol and xylenol.

In particular, polyhydric phenol compounds (y) represented by the general formula (IV) shown below exhibit excellent manifestation of the effects of the present invention, and are consequently preferred.

[Formula 5]

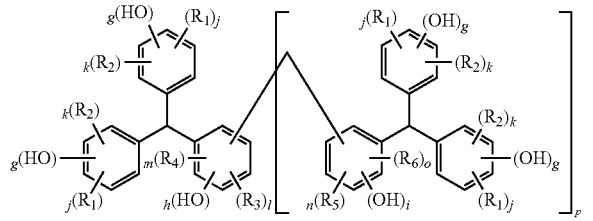

(IV)

In the above formula, $R_1$ through $R_6$ each represent, independently, an alkyl group or aromatic hydrocarbon group of 1 to 10 carbon atoms, and these structures may also include a hetero atom. More specifically, the groups $R_1$ through $R_6$ each represent, independently, a straight-chain or branched lower alkyl group of 1 to 10 carbon atoms, and even more preferably 1 to 5 carbon atoms, a cyclic alkyl group of 5 to 6 carbon atoms, or an aromatic hydrocarbon group. These alkyl groups or aromatic hydrocarbon groups may include a hetero atom such as an oxygen atom, nitrogen atom, or sulfur atom within the structure. Specific examples of suitable aromatic hydrocarbon groups include a phenyl group, tolyl group, xylyl group, mesityl group, phenethyl group, or naphthyl group.

g and j each represent, independently, an integer of 1 or greater, and preferably an integer from 1 to 2, k represents either 0 or an integer of 1 or greater, and preferably an integer that does not exceed 2, and g+j+k is no greater than 5.

h is an integer of 1 or greater, and preferably from 1 to 2, l and m each represent, independently, either 0 or an integer of 1 or greater, and preferably an integer that does not exceed 2, and h+l+m is no greater than 4.

i is an integer of 1 or greater, and preferably from 1 to 2, n and o each represent, independently, either 0 or an integer of 1 or greater, and preferably an integer that does not exceed 2, and i+n+o is no greater than 4.

p is either 0 or 1, and is preferably 1.

Of these possibilities, compounds in which $R_1$ is a cycloalkyl group or a lower alkyl group of 1 to 5 carbon atoms, j is 1, $R_2$ is a lower alkyl group, k is 1, and g is 1 are preferred.

In addition, compounds in which $R_1$ is a cycloalkyl group or a lower alkyl group of 1 to 5 carbon atoms, j is 1, $R_2$ is a lower alkyl group, k is 1, and g is 1, and moreover, l, m, n and o are zero, and h and i are both 1 enable the formation of a fine pattern with reduced LER and a high level of resolution, and are consequently preferred.

Of the polyhydric phenol compounds represented by the above general formula (IV), the most preferred compounds are the polyhydric phenol compounds represented by formulas (V) and (VI) shown below.

[Formula 6]

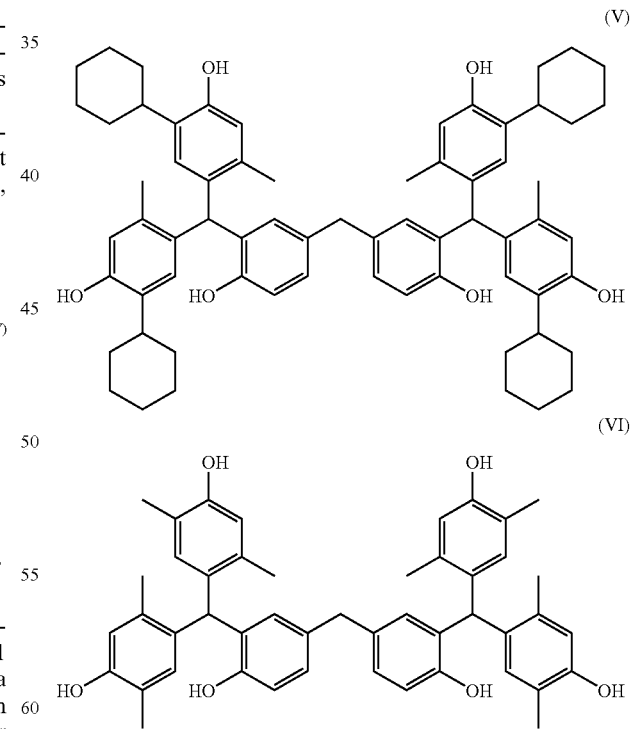

In the present invention, the polyhydric phenol compound (y) must have a molecular weight within a range from 300 to 2,500, and this molecular weight is preferably from 450 to 1,500, and even more preferably from 500 to 1,200. By ensuring that the molecular weight is no higher than the above upper limit, an adequate LER reduction effect can be achieved. Furthermore, the resolution also improves. Furthermore, ensuring that the molecular weight is at least as large as the lower limit enables the formation of a resist pattern with a favorable profile shape.

Furthermore, polyhydric phenol compounds (y) in which the molecular weight dispersity (Mw/Mn) is no more than 1.5 exhibit superior effects for the present invention, and are consequently preferred. It is thought that the reason for this observation is that a narrower molecular weight distribution for the polyhydric phenol compound (y) results in comparatively uniform alkali solubility for each of the protected materials and the unprotected material. Smaller dispersity values are preferred, and the dispersity value is even more preferably no more than 1.4, and is most preferably 1.3 or smaller. In those cases where a single polyhydric phenol compound (y) is used alone in the base material, the dispersity is 1.

The dispersity can be adjusted either by removing reaction by-products and impurities following synthesis of the polyhydric phenol compound (y) that represents the targeted product, or by using conventional methods such as molecular weight fractionation treatments to remove the unneeded molecular weight fractions.

The dispersity is calculated by measuring the weight average molecular weight (Mw) and the number average molecular weight (Mn) using a typical method used for the measurement of these Mw and Mn values for a polymer, such as a gel permeation chromatography method, and then determining the Mw/Mn ratio.

Furthermore, the polyhydric phenol compound (y) is preferably a material capable of forming an amorphous (non-crystalline) film using a spin coating method. In this description, an amorphous film refers to an optically transparent film that does not crystallize. A judgment as to whether or not the polyhydric phenol compound is capable of forming an amorphous film using spin coating is made in the same manner as that described above for the polyhydric phenol compound (x).

<Protected Material (Y1)>

The protected material (Y1) is a compound in which either a portion of, or all of, the phenolic hydroxyl groups of the polyhydric phenol compound (y) have been protected by substitution with acid dissociable, dissolution inhibiting groups.

There are no particular restrictions on the acid dissociable, dissolution inhibiting groups, and any group can be selected from amongst the various acid dissociable, dissolution inhibiting groups proposed for use within the hydroxystyrene-based resins and (meth)acrylate-based resins and the like used within conventional KrF or ArF chemically amplified resist compositions.

Specific examples of suitable groups include chain-like alkoxyalkyl groups, tertiary alkyloxycarbonyl groups, tertiary alkyl groups, tertiary alkoxycarbonylalkyl groups, and cyclic ether groups.

Examples of suitable chain-like alkoxyalkyl groups include a 1-ethoxyethyl group, ethoxymethyl group, 1-methoxyethyl group, 1-methoxymethylethyl group, methoxymethyl group, 1-isopropoxyethyl group, 1-methoxypropyl group, 1-ethoxypropyl group, and 1-n-butoxyethyl group.

Examples of suitable tertiary alkyloxycarbonyl groups include a tert-butyloxycarbonyl group and tert-amyloxycarbonyl group.

Examples of suitable tertiary alkyl groups include chain-like tertiary alkyl groups such as a tert-butyl group and tert-amyl group, and tertiary alkyl groups that include an aliphatic polycyclic group such as a 2-methyladamantyl group and 2-ethyladamantyl group.

Examples of suitable tertiary alkoxycarbonylalkyl groups include a tert-butyloxycarbonylmethyl group and tert-amyloxycarbonylmethyl group.

Examples of suitable cyclic ether groups include a tetrahydropyranyl group and tetrahydrofuranyl group.

Of these groups, in terms of providing excellent resolution, enhancing the uniformity of the protected material (Y1), and improving the level of LER, a chain-like alkoxyalkyl group is preferred, and a 1-ethoxyethyl group or ethoxymethyl group is particularly desirable.

Furthermore, in those cases where the protected material (Y1) contains a plurality of polyhydric phenol compounds (hereafter also referred to as isomers) with differing quantities of phenolic hydroxyl groups protected with acid dissociable, dissolution inhibiting groups (different protection numbers), materials in which the protection numbers for each isomer are close in value produce superior effects for the present invention, and are consequently preferred.

The proportion of the protected material (Y1) within the base material for the pattern-forming material is preferably greater than 40% by weight, even more preferably greater than 50% by weight, even more preferably greater than 80% by weight, and is most preferably 100% by weight.

<Unprotected Material (Y2)>

The unprotected material (Y2) is a material in which none of the phenolic hydroxyl groups of the aforementioned polyhydric phenol compound (y) are protected by acid dissociable, dissolution inhibiting groups, and in a base material for a pattern-forming material according to the present invention, the proportion of this unprotected material (Y2) must be no higher than 60% by weight. This proportion of the unprotected material (Y2) is preferably as small as possible, and is even more preferably no higher than 50% by weight, even more preferably 10% by weight or less, and is most preferably 0% by weight. Provided this proportion of the unprotected material (Y2) is no higher than 60% by weight, the level of LER can be further reduced during pattern formation. Moreover, the resolution is also superior.

The base material for a pattern-forming material can be produced either by first producing the protected material (Y1) using a method in which either all of, or a portion of, the phenolic hydroxyl groups of either one, or two or more polyhydric phenol compounds (y) are protected with acid dissociable, dissolution inhibiting groups using known techniques, and then using gel permeation chromatography (GPC) to remove the unprotected material (Y2), or protecting the unprotected material (Y2) with the aforementioned acid dissociable, dissolution inhibiting groups through appropriate conditions.

Furthermore, in the protected material (Y1), the protection number for each of the isomers can be adjusted by altering the conditions of the method used to effect the protection with acid dissociable, dissolution inhibiting groups.

In the base material for a pattern-forming material, the relative proportions of the protected material (Y1), each of the isomers of the protected material (Y1), and the unprotected material (Y2) can be measured using a technique such as reverse phase chromatography.

Furthermore, from the viewpoints of resolution and the LER reduction effect, the phenolic hydroxyl group protection ratio within the base material for a pattern-forming material, that is, the proportion of phenolic hydroxyl groups that have been protected with acid dissociable, dissolution inhibiting groups relative to the combined total of phenolic hydroxyl groups that have been protected with acid dissociable, dissolution inhibiting groups and unprotected phenolic hydroxyl groups, is preferably within a range from 5 to 50 mol %, and even more preferably from 7 to 30 mol %.

A base material for a pattern-forming material of the present invention is ideal as the base material for a positive resist composition described below.

<<Positive Resist Composition>>

A positive resist composition according to a third aspect of the present invention includes a base material component (A) (hereafter also referred to as the "component (A)"), which contains acid dissociable, dissolution inhibiting groups and displays increased alkali solubility under the action of acid, and an acid generator component (B) (hereafter also referred to as the "component (B)") that generates acid on exposure.

In the component (A), the action of acid generated from the component (B) by exposure causes the acid dissociable, dissolution inhibiting groups to dissociate, causing the entire component (A) to change from an alkali-insoluble state to an alkali-soluble state.

As a result, when a resist film formed from the positive resist composition is either selectively exposed during the formation of a resist pattern, or alternatively is exposed and then subjected to post exposure baking, the exposed portions of the resist shift to an alkali-soluble state, whereas the unexposed portions remain insoluble in alkali, meaning alkali developing can then be used to form a positive resist pattern.

<Component (A)>

The component (A) is the base material for a pattern-forming material (hereafter referred to as the polyhydric phenol-based base material (A1)) according to either one of the aforementioned first and second aspects of the present invention.

The quantity of the component (A) within a positive resist composition of the present invention may be altered in accordance with the film thickness of the resist to be formed. A typical quantity, expressed as a solid fraction concentration, is within a range from 3 to 25% by weight, and even more preferably from 10 to 20% by weight.

<Component (B)>

In the present invention, the component (B) can use any of the known acid generators used in conventional chemically amplified resist compositions without any particular restrictions. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes, poly(bis-sulfonyl)diazomethanes, and diazomethane nitrobenzyl sulfonates, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, and diphenylmonomethylsulfonium trifluoromethanesulfonate, heptafluoropropanesulfonate or nonafluorobutanesulfonate. Of these, onium salts with a fluorinated alkylsulfonate ion as the anion are preferred.

Specific examples of suitable oxime sulfonate-based acid generators include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

Of the various diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

[Formula 7]

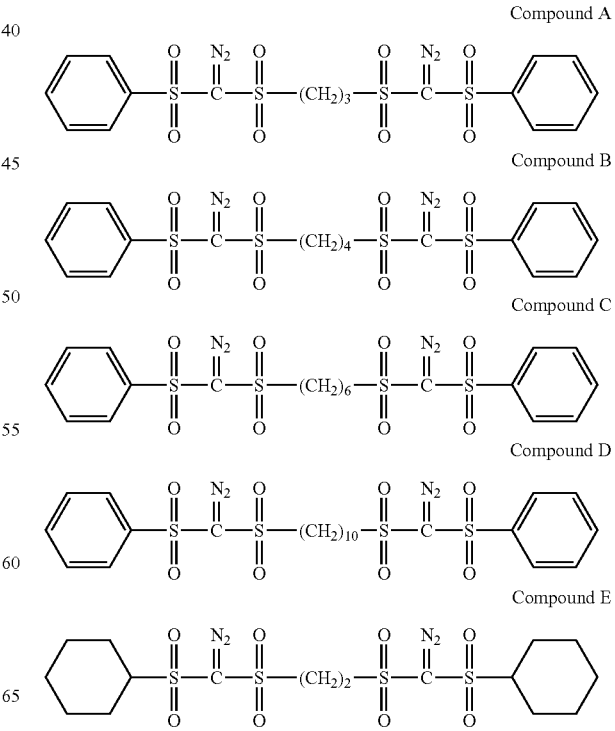

-continued

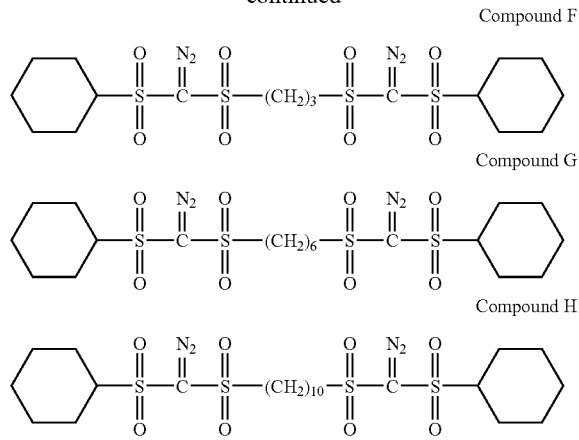

Compound F

Compound G

Compound H

As the component (B), either a single acid generator may be used alone, or a combination of two or more different acid generators may be used.

The quantity used of the component (B) is typically within a range from 0.5 to 30 parts by weight, and preferably from 1 to 10 parts by weight, per 100 parts by weight of the component (A). At quantities less than the above range, there is a danger that pattern formation may not proceed satisfactorily, whereas if the quantity exceeds the above range, achieving a uniform solution becomes difficult, and there is a danger of a deterioration in the storage stability.

<Organic Solvent (C)>

A positive resist composition of the present invention can be produced by dissolving the aforementioned component (A) and component (B), and each of the optional components described below in an organic solvent (C).

The organic solvent (C) may be any solvent capable of dissolving each of the components used to generate a uniform solution, and either one, or two or more solvents selected from known materials used as the solvents for conventional chemically amplified resists can be used.

Suitable examples include γ-butyrolactone; ketones such as acetone, methyl ethyl ketone, cyclohekanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents (C) may be used either alone, or as a mixed solvent of two or more different solvents.

Furthermore, a mixed solvent formed by mixing propylene glycol monomethyl ether acetate (PGMEA) and a polar solvent is preferred, and the mixing ratio can be determined on the basis of the co-solubility of the PGMEA and the polar solvent, but is preferably within a range from 1:9 to 9:1, and even more preferably from 2:8 to 8:2.

More specifically, in those cases where EL is added as the polar solvent, the weight ratio of PGMEA:EL is preferably within a range from 2:8 to 8:2, and even more preferably from 3:7 to 7:3.

Furthermore, as the organic solvent (C), a mixed solvent of at least one of PGMEA and EL, together with γ-butyrolactone is also preferred. In such cases, the mixing ratio is set so that the weight ratio between the former and latter components is preferably within a range from 70:30 to 95:5.

There are no particular restrictions on the quantity used of the organic solvent (C), which is set in accordance with the coating film thickness so as to produce a concentration that enables favorable application to a substrate or the like, and is typically sufficient to produce a solid fraction concentration within the resist composition of 2 to 20% by weight, and preferably from 5 to 15% by weight.

<Component (D)>

In a positive resist composition of the present invention, in order to improve the resist pattern shape and the post exposure stability of the latent image formed by the pattern-wise exposure of the resist layer, a nitrogen-containing organic compound (D) (hereafter referred to as the component (D)) can be added as an optional component.

A multitude of these organic compounds have already been proposed, and any of these known compounds can be used as the component (D), although an amine, and particularly a secondary lower aliphatic amine or tertiary lower aliphatic amine is preferred.

Here, an aliphatic amine refers to an alkyl or alkyl alcohol amine of no more than 15 carbon atoms, and examples of these secondary and tertiary amines include trimethylamine, diethylamine, triethylamine, di-n-propylamine, tri-n-propylamine, tripentylamine, tri-n-octylamine, diethanolamine, triethanolamine, and triisopropanolamine. Of these, tertiary alkanolamines such as triethanolamine and triisopropanolamine, and tertiary alkyl amines such as tri-n-octylamine are particularly preferred.

These compounds can be used either alone, or in combinations of two or more different compounds.

The component (D) is typically used in a quantity within a range from 0.01 to 5.0 parts by weight per 100 parts by weight of the component (A).

<Component (E)>

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

<Other Optional Components (G)>

Other miscible additives can also be added to a positive resist composition of the present invention according to need, and examples include additive resins for improving the performance of the resist film, surfactants for improving the ease of application, dissolution inhibitors, plasticizers, stabilizers, colorants, and halation prevention agents.

Examples of suitable additive resins include those resins proposed as base resins for conventional chemically amplified KrF positive resist compositions and ArF positive resist compositions, and these resins can be selected appropriately in accordance with the type of exposure light source used during resist pattern formation. The proportion of these additive resins must be kept within a range that does not impair the effects of the present invention, and is preferably no higher than 20% by weight, and even more preferably 10% by weight or less, relative to the total solid fraction of the positive resist composition.

<<Method of Forming Resist Pattern>>

Using a positive resist composition of the present invention, a resist pattern can be formed using, for example, the type of resist pattern formation method described below.

Namely, a positive resist composition described above is first applied to the surface of a substrate such as a silicon wafer using a spinner or the like, a prebake (PAB) is conducted under temperature conditions of 80 to 150° C. for 40 to 120 seconds, and preferably for 60 to 90 seconds, and the resulting film is then subjected to selective exposure with an electron beam or extreme ultraviolet radiation or the like, using an electron beam lithography apparatus or the like. In other words, following exposure through a mask pattern or patterning of the resist film by direct irradiation with an electron beam without using a mask pattern, PEB (post exposure baking) is conducted under temperature conditions of 70 to 150° C. for 40 to 500 seconds, and preferably for 60 to 300 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

There are no particular restrictions on the wavelength of radiation used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A positive resist composition according to the present invention is particularly useful for irradiation using EB and EUV, and especially for EB.

As described above, a positive resist composition containing as a base component, a base material for a pattern-forming material according to the present invention, that is, a polyhydric phenol-based base material (A1) enables the formation of a fine pattern with reduced LER and a high level of resolution.

The reasons for the reduction in LER are not entirely clear, but the following reasons are conceivable. Namely, roughness within the resist film surface (LER) generated during formation of the resist pattern may be caused by variations in the solubility within the alkali developing solution of the molecules that constitute the base component of the resist film (hereafter, the molecules that constitute the base component of the resist film may also be referred to as "matrix molecules"), as described in 1 and 2 below.

1. In a base material containing matrix molecules with alkali-soluble groups that are either partially protected or completely protected with acid dissociable, dissolution inhibiting groups, variations in the alkali solubility of the base material itself can be caused by factors such as the number of acid dissociable, dissolution inhibiting groups within each matrix molecule, the number of unprotected alkali-soluble groups, and the breadth of the molecular weight distribution (the dispersity) for each of the matrix molecules.

2. Variations in the deprotection reaction that occurs during exposure and causes dissociation of the acid dissociable, dissolution inhibiting groups attached to the chemically amplified alkali-soluble matrix.

Based on the above observations, control of at least factor 1 of the reasons described above is very difficult using the types of polymers that have conventionally been used as the base materials of resists. In other words, because polymers are obtained using methods such as polymerization, achieving a uniform molecular weight for the product polymer is extremely difficult. Although living polymerization is a process that enables a polymer with a comparatively uniform molecular weight distribution to be obtained, in order to conduct a living polymerization, various restrictions must be applied to factors such as the skeleton of the monomer being used and the polymerization solvent, and in practice, achieving a polymer of uniform molecular weight is difficult. Moreover, the polymers typically used in pattern-forming materials are usually copolymers produced using two or more monomers with different functionalities in terms of structure and alkali solubility and the like, and introducing monomers with different side-chain structures into each copolymer in a uniform manner, that is, ensuring a complete match in terms of the monomer composition within each copolymer molecule within the product copolymer, and ensuring a uniform distribution of each monomer within each copolymer molecule is extremely difficult.

In this manner, it is thought that because a polymer in which the molecular weight distribution and the monomer composition ratio are non-uniform when viewed at the micro level is used as the base material of the pattern-forming material, a variety of problems arise during the lithography process. For example, in the spin coating step for forming the resist film, highly hydrophilic polymers and highly hydrophobic polymers form their own respective domains, which causes variations in the distribution of the acid generator and the like. As a result, the degree to which the dissociation (the deprotection reaction) of the acid dissociable, dissolution inhibiting groups caused by the acid proceeds at the interface between the exposed portions and the unexposed portions is not uniform, meaning variations develop in the alkali solubility of each polymer molecule following the deprotection reaction, and variations also develop in the dissolution rate of the resist film.

Any such small differences in the solubility of each polymer within the resist causes an increase in the level of LER. Accordingly, in order to reduce the level of LER, the alkali solubility behavior of each polymer must be controlled, but as described above, achieving uniform alkali solubility within the polymer itself is difficult, meaning reducing the level of LER is also problematic.

Furthermore, in the case of the low molecular weight materials proposed in the aforementioned patent references 1 and 2, it is thought that although the fact that the root mean squared radius is smaller than that of a polymer should suppress any increase in LER, absolutely no consideration is given to the difference in alkali solubility between the protected material and the unprotected material, meaning the level of LER was unable to be satisfactorily reduced.

Moreover, in terms of the first aspect of the present invention, absolutely no consideration was given as to whether or not the material itself was able to form an amorphous film, and it is thought that this is the reason that the LER was unable to be adequately reduced. In other words, possible reasons for a worsening of LER include the problem of storage stability as a resist solution, wherein foreign matter develops within the resist composition upon storage, and the problem of developing defects observed on the pattern surface at the time of pattern formation, and according to the investigations of the inventors of the present invention, although not entirely clear, it is believed that one cause of these problems is the fact that because the aforementioned low molecular weight compounds exhibit a high level of crystallinity, formation of an amorphous film using these compounds is impossible. In other words, it is believed that in order to reduced the level of LER, it is desirable that the matrix itself is capable of forming a stable, amorphous film.

In a conventional resist composition, it is already known that even if the matrix itself is a material with a high degree of crystallinity, the incorporation of materials that alter the structure, so-called impurities, usually results in a fall in the level of crystallinity of the material, and it is thought that as a result, the overall resist composition, produced by adding a plurality of materials including an acid generator, a quencher, and a solvent to the alkali-soluble matrix provided with acid-dissociable protective groups, becomes a material that is capable of generating an amorphous film.

In contrast, a base material for a pattern-forming material according to the first aspect of the present invention includes a low molecular weight compound (X1), which is formed from a polyhydric phenol compound (x) that has a specific molecular weight and molecular weight dispersity and is capable of forming an amorphous film, and in particular a polyhydric phenol compound having an aforementioned specific structure (I) through (III), wherein the phenolic hydroxyl groups (the alkali-soluble groups) are protected with acid dissociable, dissolution inhibiting groups, and as a result, the alkali solubility of the total material is comparatively uniform, and it is thought that this uniformity is the reason for the improvement in LER.

Furthermore, a base material for a pattern-forming material according to a second aspect of the present invention includes a protected material (Y1), which is formed from a polyhydric phenol compound (y) with a molecular weight that falls within a specific range by protecting the phenolic hydroxyl groups (the alkali-soluble groups) with acid dissociable, dissolution inhibiting groups, wherein the proportion of an unprotected material (Y2) is no more than a predetermined quantity, and as a result, the overall alkali solubility is comparatively uniform, and it is thought that this uniformity is the reason for the improvement in LER.

Furthermore, the low molecular weight compounds incorporated within the base materials for pattern-forming materials according to the first and second aspects of the present invention have a low molecular weight that falls within a specific range, and consequently even if the protection number for the alkali-soluble groups within a single molecule is small, an adequate protection number is still achieved across the total base material, meaning a satisfactory level of dissolution contrast following exposure can still be achieved for a positive resist composition containing one of these low molecular weight compounds, and moreover, the resolution also improves.

In addition, the present invention also yields an improvement in the level of defects (developing defects), which represent a significant problem in conventional lithography processes. In other words, defects can appear in many different forms and for a variety of reasons, but the existence within the resist composition, and more specifically within the base material, of polymers with dramatically different dissolution behaviors is acknowledged as one primary cause. In the case of the types of polymer systems used in conventional resists, it is thought that polymers containing a high proportion of a monomer having non-acid dissociable, dissolution inhibiting groups with no alkali solubility undergo extremely little variation in polarity even under the action of acid in the exposed portions, and either appear as developing residues, or alternatively, may be dissolved during the developing process as a result of the dissolution of the surrounding polymers, but then precipitate out during the subsequent pure water rinse process and adhere to the surface of the resist thin film.

However in the present invention, as described above, the alkali solubility of each of the molecules within the material is comparatively uniform, and it is thought that this uniformity also leads to an improvement in the level of defects.

EXAMPLES

As follows is a description of examples of the present invention, although the present invention is in no way limited by these examples.

Reference Example 1

Polyhydric phenol compounds No. 01 to 19, represented by the formulas shown below, were evaluated for solubility and amorphicity using the procedures described below.

[Formula 8]

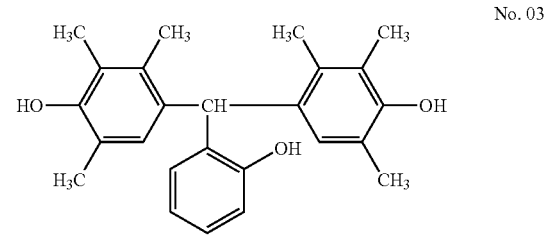

No. 03

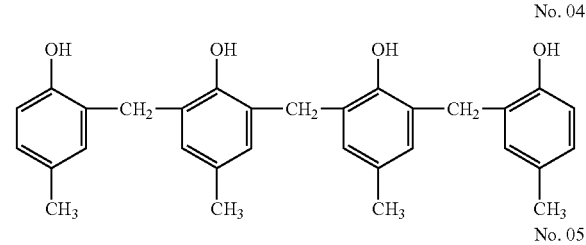

No. 04

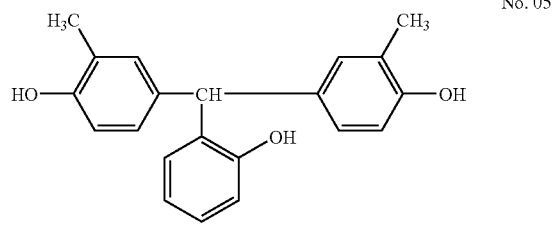

No. 05

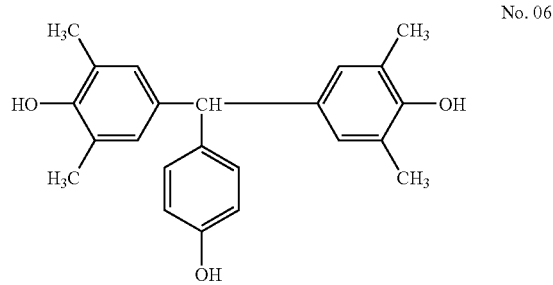

No. 06

No. 07
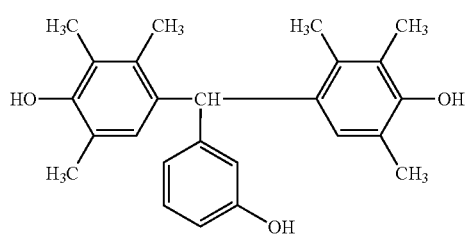
[Formula 9]
No. 08
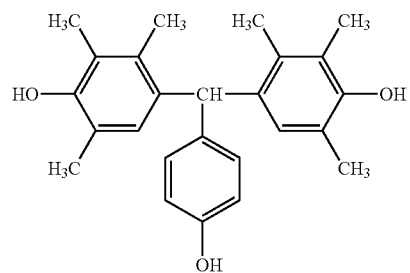
No. 09
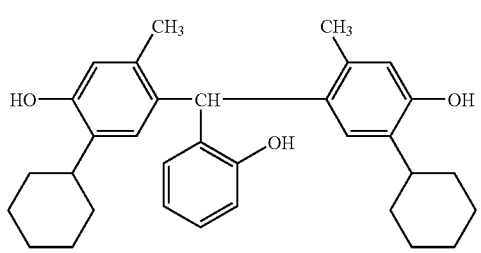
No. 12
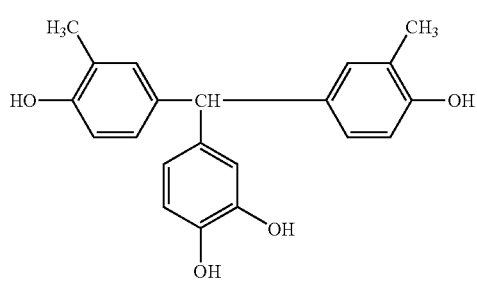
No. 13
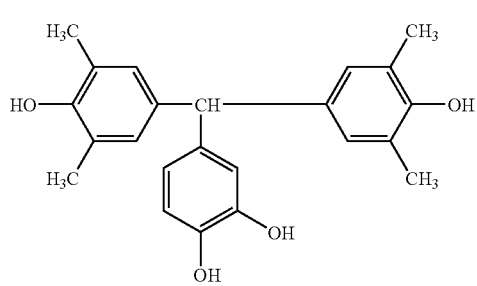
[Formula 10]
No. 14
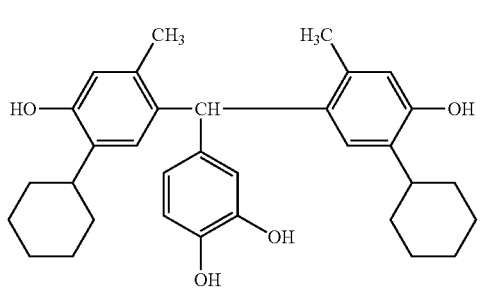
No. 17
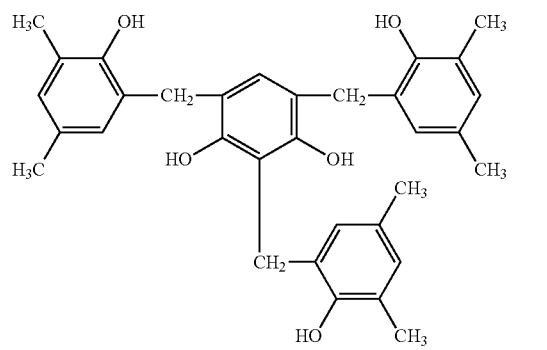
No. 18
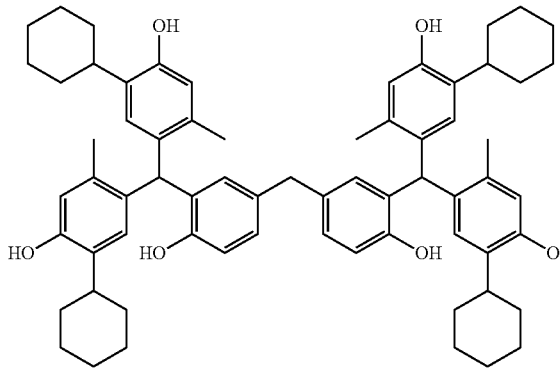
[Formula 11]
No. 19
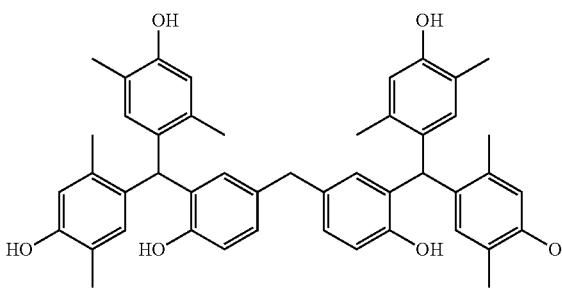
[Formula 12]
No. 01
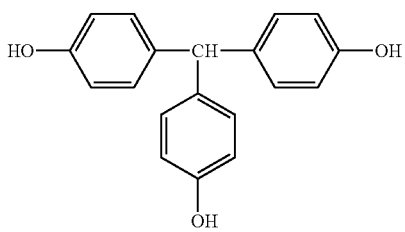
No. 02
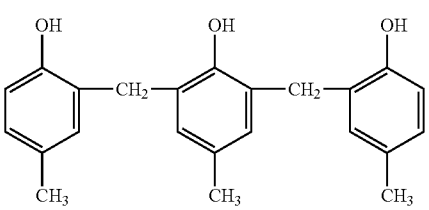

-continued

No. 11
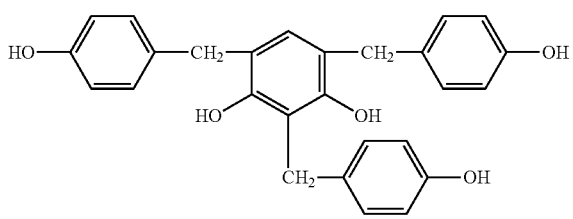

No. 15
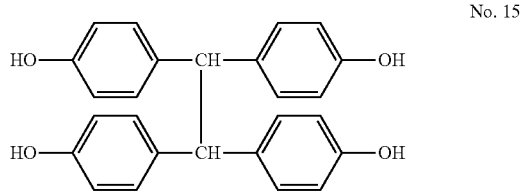

[Formula 13]

No. 16
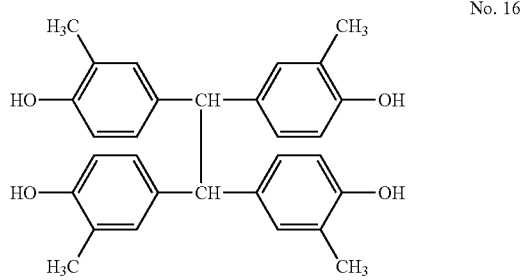

No. 10
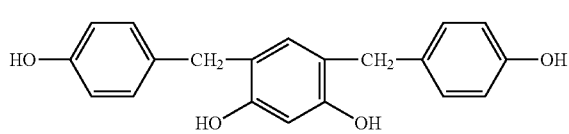

[Solubility]

A mixed solvent of ethyl lactate and propylene glycol monoethyl ether acetate in a ratio (weight ratio) of 40/60 (hereafter this solvent is abbreviated as EM) was added to each of the compounds No. 01 to 19 in sufficient quantity to produce concentrations of 14% by weight, and the resulting mixtures were then subjected to ultrasound treatment (dissolution treatment) using an ultrasound cleaning apparatus, thus yielding a series of samples. Following the ultrasound treatment, each sample was left to stand overnight at room temperature, and the dissolution state of the sample was then confirmed visually.

Subsequently, those samples which were found to not dissolve completely in the EM solubility evaluation were re-evaluated in a similar manner using tetrahydrofuran (THF) and methyl ethyl ketone (MEK) instead of the EM.

The results are shown in Table 1. In Table 1, the symbol ○ indicates complete dissolution, the symbol Δ indicates that complete dissolution did not occur, and impurities were visible, and the symbol × indicates either that although the compound had dissolved following ultrasound treatment, it recrystallized on standing, or that the compound had not dissolved even after the ultrasound treatment.

[Amorphicity]

Each of the samples that did not return an evaluation of × in the above solubility evaluation (14% by weight EM solutions) was filtered through a disc filter with a pore size of 0.45 microns, and 2 ml of the solution was then applied to a silicon wafer by spin coating at 1,500 rpm, thus forming a film of thickness 450 nm. At this point, a visual inspection was undertaken to confirm whether or not an amorphous (non-crystalline) film (an optically transparent film) had been formed.

Following spin coating, the wafer with the amorphous film formed thereon was subjected to drying and baking (PAB, Post Applied Bake) at 110° C. for 90 seconds.

At this point, once again a visual inspection was undertaken to confirm whether or not an amorphous film had been formed.

Following the above spin coating, the wafer with the amorphous film formed thereon was stored for 2 weeks under room temperature conditions inside a wafer cassette case. After this storage, another visual inspection was undertaken to confirm whether or not the amorphous film was still formed.

The results are shown in Table 1. In table 1, the symbol ○ indicates that an amorphous film had been formed, the symbol × indicates that a film was not able to be formed, and the symbol "Cryst" indicates that crystallized portions were formed either partially or across the entire wafer surface.

The term "after spin coating" refers to the state following spin coating and prior to PAB treatment, the term "after PAB" refers to the state following commencement of PAB, up until the point where the wafer has returned to room temperature following the PAB treatment.

In the Table, the superscript *1 means the sample was also insoluble in ethyl lactate, toluene, butyl acetate, and 2-heptanone.

TABLE 1

| Compound No. | Molecular weight | Solubility | | | Amorphicity | | |
|---|---|---|---|---|---|---|---|
| | | EM | THF | MEK | after spin coating | after PAB | after 2 weeks |
| No. 03 | 376 | ○ | — | — | ○ | ○ | ○ |
| No. 04 | 468 | ○ | — | — | ○ | ○ | ○ |
| No. 05 | 320 | ○ | — | — | ○ | ○ | ○ |
| No. 06 | 348 | ○ | — | — | ○ | ○ | ○ |
| No. 07 | 376 | ○ | — | — | ○ | ○ | ○ |
| No. 08 | 376 | ○ | — | — | ○ | ○ | ○ |
| No. 09 | 484 | ○ | — | — | ○ | ○ | ○ |
| No. 12 | 336 | ○ | — | — | ○ | ○ | ○ |
| No. 13 | 364 | ○ | — | — | ○ | ○ | ○ |
| No. 14 | 500 | ○ | — | — | ○ | ○ | ○ |
| No. 17 | 512 | ○ | — | — | ○ | ○ | ○ |
| No. 18 | 981 | ○ | — | — | ○ | ○ | ○ |
| No. 19 | 709 | ○ | — | — | ○ | ○ | ○ |
| No. 01 | 292 | ○ | — | — | ○ | Cryst | — |
| No. 02 | 348 | × | ○ | ○ | ○ | Cryst | — |
| No. 10 | 322 | ○ | — | — | ○ | Cryst | — |
| No. 11 | 428 | × | Δ *1 | Δ | × | Cryst | — |
| No. 15 | 398 | × | × *1 | × | — | — | — |
| No. 16 | 454 | × | × *1 | × | — | — | — |

From the results shown in Table 1 it is evident that the compounds No. 03 through 09, 12 through 14, and 17 through 19 exhibited favorable solubility in EM. Furthermore, these compounds had also formed an amorphous film, both following spin coating and following PAB treatment. In addition, the film stability was also favorable, and the amorphous film had been retained even after 2 weeks.

Production Example 1

10 g of the polyhydric phenol compound No. 18 from the above reference example 1 (molecular weight: 981, hereafter abbreviated as MBSA) was dissolved in 33 g of tetrahydrofuran, 1.8 g of ethyl vinyl ether was added, and the resulting mixture was reacted for 12 hours at room temperature under constant stirring. Following completion of the reaction, the product was extracted and purified using a water/ethyl acetate system, yielding 10.1 g of a base material for a pattern-forming material (a1).

Using a 400 MHz proton NMR apparatus manufactured by JEOL Ltd., the number of phenolic hydroxyl groups within the base material for a pattern-forming material (a1), and the number of phenolic hydroxyl groups protected with 1-ethoxyethyl groups were measured, and when the formula below was used to calculate the protection ratio (mol %) within the base material for a pattern-forming material (a1), a protection ratio of 19.9 mol % was obtained.

{Number of phenolic hydroxyl groups protected with 1-ethoxyethyl groups/(number of phenolic hydroxyl groups+number of phenolic hydroxyl groups protected with 1-ethoxyethyl groups)}× 100

Production Example 2

10 g of the polyhydric phenol compound No. 19 from the above reference example 1 (molecular weight: 708, hereafter abbreviated as MBSA-2) was dissolved in 33 g of tetrahydrofuran, 4.9 g of ethyl vinyl ether was added, and the resulting mixture was reacted for 12 hours at room temperature under constant stirring. Following completion of the reaction, the product was extracted and purified using a water/ethyl acetate system, yielding a base material for a pattern-forming material (a2).

Using a 400 MHz proton NMR apparatus manufactured by JEOL Ltd., the number of phenolic hydroxyl groups within the base material for a pattern-forming material (a2), and the number of phenolic hydroxyl groups protected with 1-ethoxyethyl groups were measured, and when the formula below was used to calculate the protection ratio (mol %) within the polyhydric phenol material (a2), a protection ratio of 50.1 mol % was obtained.

{Number of phenolic hydroxyl groups protected with 1-ethoxyethyl groups/(number of phenolic hydroxyl groups+number of phenolic hydroxyl groups protected with 1-ethoxyethyl groups)}× 100

Example 1

The base material for a pattern-forming material (a1) obtained in the production example 1, together with 10% by weight of triphenylsulfonium nonafluorobutanesulfonate and 1% by weight of tri-n-octylamine relative to the combined solid fraction within the base material were dissolved in a mixed solvent of ethyl lactate/propylene glycol monomethyl ether acetate=40/60 (weight ratio), thus forming a positive resist composition solution with a solid fraction concentration of 6% by weight.

Example 2

With the exception of replacing the base material for a pattern-forming material (a1) used in the example 1 with the base material for a pattern-forming material (a2), a positive resist composition solution was prepared in the same manner as the example 1.

Comparative Example 1

With the exception of replacing the base material for a pattern-forming material (a1) used in the example 1 with a polyhydroxystyrene resin (polystyrene equivalent Mw determined using GPC: 8,000, polydispersity: 2.65) in which a portion of the phenolic hydroxyl groups had been protected with 1-ethoxyethyl groups (protection ratio: 30.7 mol %), a positive resist composition solution was prepared in the same manner as the example 1.

[Evaluation Tests]

Using the positive resist compositions obtained in the examples 1 and 2, and the comparative example 1, the evaluations described below were conducted.

[Resolution]

Each positive resist composition solution was applied uniformly, using a spinner, to the surface of an 8-inch silicon substrate that had been treated with hexamethyldisilazane, and was then subjected to a bake treatment (PAB) at 110° C. for 90 seconds, thus forming a resist film (film thickness: 150 nm). This resist film was then subjected to direct patterning with an electron beam lithography apparatus (HL-800D, manufactured by Hitachi Ltd., accelerating voltage: 70 kV), and was then subjected to a bake treatment (PEB) at 110° C. for 90 seconds, developed for 60 seconds in a 2.38% by weight aqueous solution of tetramethylammonium hydroxide (TMAH), and rinsed in pure water for 30 seconds, thus forming a line and space (L/S) pattern.

The thus obtained resist pattern was inspected using a measuring SEM, and the resolution was determined.

In the example 2, the conditions were altered so that the PAB was conducted at 80° C. for 90 seconds and the PEB was conducted at 70° C. for 300 seconds.

The results of the above evaluation revealed the formation a 50 nm line and space pattern for the example 1, an 80 nm line and space pattern for the example 2, and a 70 nm line and space pattern for the comparative example 1.

[Surface Roughness]

Each positive resist solution was applied uniformly, using a spinner, to the surface of an 8-inch silicon substrate that had been treated with hexamethyldisilazane, and was then subjected to a bake treatment at 110° C. for 90 seconds, thus forming a resist film (film thickness: 160 nm).

This resist film was then exposed with an electron beam lithography apparatus (HL-800D, manufactured by Hitachi Ltd., accelerating voltage: 70 kV) using an exposure dose of 10 µC/cm$^2$, subjected to a bake treatment at 110° C. for 90 seconds, and was subsequently developed in a 2.38% by weight aqueous solution of tetramethylammonium hydroxide (TMAH), using a developing time that resulted in a film thickness following developing that was approximately 90% of the initial film thickness (60 seconds in the examples 1 and 2, and 15 seconds in the comparative example 1), and then rinsed in pure water for 30 seconds.

Following rinsing, the surface of the resist film was inspected using an AFM (atomic force microscope: DI NANOSCOPE IV/D5000, manufactured by Veeco Instruments Inc.), and the root mean squared roughness (Rms) per square µm was determined.

The results revealed values of 1.98 nm for the example 1, 0.90 nm for the example 2, and 5.36 nm for the comparative example 1.

In this manner, the positive resist compositions of the examples 1 and 2 exhibited high levels of resolution and minimal surface roughness. In contrast, although the comparative example 1, which used a polyhydroxystyrene resin with a Mw of 8,000 and a polydispersity of 2.65, exhibited high resolution, the surface roughness was very large in comparison with that of the examples 1 and 2.

The existence of a positive correlation between surface roughness and pattern LER has already been noted by Yamaguchi et al. (for example, see T. Yamaguchi et al., J. Photopolymer Sci. Technol., 10 (1997), 635), and consequently, from the above results it is evident that the LER is very favorable for the patterns obtained using the positive resist compositions of the examples 1 and 2. Furthermore, the improvement in the surface roughness of the rinsed resist film can be expected to also provide an improvement in the level of defects.

Production Example 3

10 g of the polyhydric phenol compound represented by the above formula (V) (molecular weight: 981, hereafter abbreviated as MBSA) was dissolved in 33 g of tetrahydrofuran, 1.8 g of ethyl vinyl ether was added, and the resulting mixture was reacted for 12 hours at room temperature under constant stirring. Following completion of the reaction, the product was extracted and purified using a water/ethyl acetate system, yielding 10.1 g of a base material for a pattern-forming material (a1).

Using a 400 MHz proton NMR apparatus manufactured by JEOL Ltd., the number of phenolic hydroxyl groups within the base material for a pattern-forming material (a1), and the number of phenolic hydroxyl groups protected with 1-ethoxyethyl groups were measured, and when the protection ratio (mol %) was calculated for the base material for a pattern-forming material (a1), a protection ratio of 19.9 mol % was obtained. The protection ratio is represented by: {number of phenolic hydroxyl groups protected with 1-ethoxyethyl groups/(number of phenolic hydroxyl groups+number of phenolic hydroxyl groups protected with 1-ethoxyethyl groups)}×100.

Furthermore, using a high performance liquid chromatography apparatus (HP-1100, manufactured by Agilent Technologies Inc.), the respective abundance ratios (% by weight) of unprotected material in which none of the 6 phenolic hydroxyl groups of the MBSA have been protected, 1-protected materials in which one of the phenolic hydroxyl groups is protected, 2-protected materials in which two of the phenolic hydroxyl groups are protected, and other protected materials (3- to 6-protected materials) were measured.

The results are shown in Table 2.

Production Example 4

With the exception of altering the quantity of the ethyl vinyl ether from the production example 3, essentially the same method was used to add the ethyl vinyl ether to the MBSA, thus yielding a base material for a pattern-forming material (a3). The protection ratio (mol %), determined in the same manner as the production example 3, was 17.1 mol %.

Furthermore, using the same high performance liquid chromatography analysis as above, the respective abundance ratios (% by weight) of unprotected material in which none of the 6 phenolic hydroxyl groups of the MBSA have been protected, 1-protected materials in which one of the phenolic hydroxyl groups is protected, 2-protected materials in which two of the phenolic hydroxyl groups are protected, and other protected materials (3- to 6-protected materials) were measured.

The results are shown in Table 2.

Production Example 5

10 g of the polyhydric phenol compound represented by the above formula (VI) (molecular weight: 708, hereafter abbreviated as MBSA-2) was dissolved in 33 g of tetrahydrofuran, 4.9 g of ethyl vinyl ether was added, and the resulting mixture was reacted for 12 hours at room temperature under constant stirring. Following completion of the reaction, the product was extracted and purified using a water/ethyl acetate system, yielding a base material for a pattern-forming material (a2).

Using a 400 MHz proton NMR apparatus manufactured by JEOL Ltd., the number of phenolic hydroxyl groups within the thus obtained base material for a pattern-forming material (a2), and the number of phenolic hydroxyl groups protected with 1-ethoxyethyl groups were measured, and when the protection ratio (mol %) was calculated for the base material for the pattern-forming material (a2), a protection ratio of 50.1 mol % was obtained. The protection ratio is represented by: {number of phenolic hydroxyl groups protected with 1-ethoxyethyl groups/(number of phenolic hydroxyl groups+number of phenolic hydroxyl groups protected with 1-ethoxyethyl groups)}×100.

Furthermore, using a high performance liquid chromatography apparatus (HP-1100, manufactured by Agilent Technologies Inc.), the respective abundance ratios (% by weight) of unprotected material in which none of the 6 phenolic hydroxyl groups of the MBSA-2 have been protected, 1-protected materials in which one of the phenolic hydroxyl groups is protected, 2-protected materials in which two of the phenolic hydroxyl groups are protected, and other protected materials (3- to 6-protected materials) were measured.

The results are shown in Table 2.

Example 3

The base material for a pattern-forming material (a1) obtained in the production example 3, together with 10% by weight of triphenylsulfonium nonafluorobutanesulfonate and 1% by weight of tri-n-octylamine relative to the combined solid fraction within the base material were dissolved in a mixed solvent of ethyl lactate / propylene glycol monomethyl ether acetate=40/60 (weight ratio), thus forming a positive resist composition solution with a solid fraction concentration of 6% by weight.

Comparative Example 2

With the exception of replacing the base material for a pattern-forming material (a1) used in the example 3 with the base material for a pattern-forming material (a3) obtained in the production example 4, a positive resist composition solution was prepared in the same manner as the example 3.

Example 4

With the exception of replacing the base material for a pattern-forming material (a1) used in the example 3 with the base material for a pattern-forming material (a2) obtained in the production example 5, a positive resist composition solution was prepared in the same manner as the example 3.

[Evaluation Tests]

Using the positive resist compositions obtained in the examples 3 and 4, and the comparative example 2, the evaluations described below were conducted. The results are shown in Table 2.

[Resolution]

Resolution was determined in the same manner as described for the example 1.

In the example 4, the conditions were altered so that the PAB was conducted at 80° C. for 90 seconds and the PEB was conducted at 70° C. for 300 seconds.

[Surface Roughness]

Surface roughness was determined in the same manner as described for the example 1. The developing time in the TMAH aqueous was 60 seconds.

TABLE 2

| | Polyhydric phenol compound | Molecular Weight | Dispersity | Protection ratio (mol %) | Abundance ratio (% by weight) | | | | Resolution | Surface roughness |
| --- | --- | --- | --- | --- | --- | --- | --- | --- | --- | --- |
| | | | | | Unprotected material | 1-protected material | 2-protected material | Other | | |
| Example 1 | MBSA | 981 | 1 | 19.9 | 41.9 | 18.3 | 20.3 | 19.5 | 50 nm L/S | 1.98 nm |
| Example 2 | MBSA-2 | 708 | 1 | 50.1 | 18.8 | 27.6 | 30.9 | 22.7 | 80 nm L/S | 0.9 nm |
| Comparative example 1 | MBSA | 981 | 1 | 17.1 | 80.3 | 3.8 | 4.2 | 11.7 | 80 nm L/S | 2.62 nm |

As is evident from the above results, the positive resist composition of the example 3 has a higher resolution and lower level of surface roughness than the comparative example 2, in which the abundance ratio of unprotected material exceeded 60% by weight. Even though the comparative example 2 has a protection ratio for the overall base material for a pattern-forming material that is similar to that of the example 3, the resolution was lower, and the surface roughness was larger.

In the example 4, because a base material for a pattern-forming material with a low abundance ratio of unprotected material was used, the surface roughness was extremely small.

The existence of a positive correlation between surface roughness and pattern LER has already been noted by Yamaguchi et al. (for example, see T. Yamaguchi et al., J. Photopolymer Sci. Technol., 10 (1997), 635), and consequently, from the above results it is evident that the LER is very favorable for the patterns obtained using the positive resist compositions of the examples 3 and 4. Furthermore, the improvement in the surface roughness of the rinsed resist film can be expected to also provide an improvement in the level of defects.

INDUSTRIAL APPLICABILITY

The present invention provides a base material for a pattern-forming material, a positive resist composition, and a method of forming a resist pattern, and consequently displays favorable industrial applicability.

The inventon claimed is:

1. A base material for a pattern-forming material, comprising a low molecular weight compound (X1), which is formed from a polyhydric phenol compound (x) that comprises two or more phenolic hydroxyl groups and satisfies conditions (1), (2), and (3) described below, wherein either a portion of, or all of, said phenolic hydroxyl groups are protected with acid dissociable, dissolution inhibiting groups, wherein
the proportion within said base material of said low molecular weight compound (X1), in which either a portion of, or all of, said polyhydric phenol compound (x) are protected with acid dissociable, dissolution inhibiting groups, is greater than 80% by weight:
(1) a molecular weight within a range from 450 to 1,500,
(2) a molecular weight dispersity of no more than 1.5,
and (3) an ability to form an amorphous film using a spin coating method.

2. A base material for a pattern-forming material according to claim 1, wherein said polyhydric phenol compound (x) is one or more compounds selected from the group consisting of polyhydric phenol compounds represented by general formulas (I), (II), and (III) shown below:

[Formula 1]

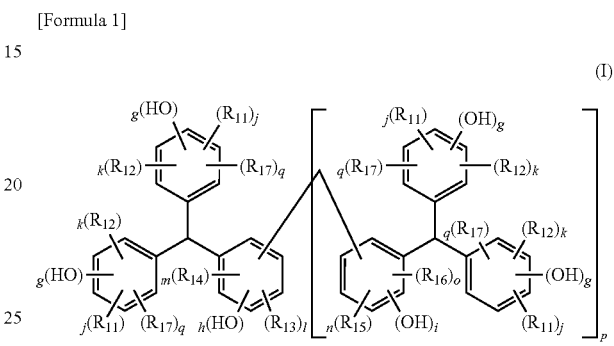

(I)

[wherein, $R_{11}$ through $R_{17}$ each represent, independently, an alkyl group or aromatic hydrocarbon group of 1 to 10 carbon atoms, and these structures may also include a hetero atom; g and j each represent, independently, an integer of 1 or greater, k and q each represent either 0 or an integer of 1 or greater, and g+j+k+q is no greater than 5; h is an integer of 1 or greater, 1 and m each represent, independently, either 0 or an integer of 1 or greater, and h+1+m is no greater than 4; i is an integer of 1 or greater, n and o each represent, independently, either 0 or an integer of 1 or greater, and i+n+o is no greater than 4; and p is either 0 or 1],

[Formula 2]

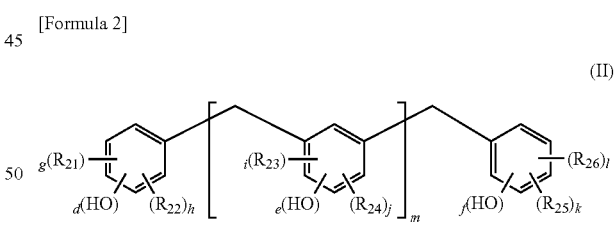

(II)

[wherein, $R_{21}$ through $R_{26}$ each represent, independently, an alkyl group or aromatic hydrocarbon group of 1 to 10 carbon atoms, and these structures may also include a hetero atom; d and g each represent, independently, an integer of 1 or greater, h represents either 0 or an integer of 1 or greater, and d+g+h is no greater than 5; e represents an integer of 1 or greater, i and j each represent, independently, either 0 or an integer of 1 or greater, and e+i+j is no greater than 4; f and k each represent, independently, an integer of 1 or greater, l represents either 0 or an integer of 1 or greater, and f+k+l is no greater than 5; and m is an integer from 1 to 20],

[Formula 3]

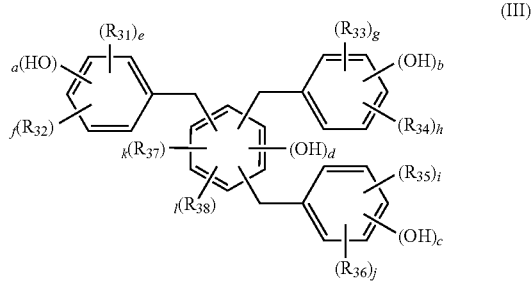

[wherein, $R_{31}$ through $R_{38}$ each represent, independently, an alkyl group or aromatic hydrocarbon group of 1 to 10 carbon atoms, and these structures may also include a hetero atom; a and e each represent, independently, an integer of 1 or greater, f represents either 0 or an integer of 1 or greater, and a+e+f is no greater than 5; b and h each represent, independently, an integer of 1 or greater, g represents either 0 or an integer of 1 or greater, and b+h+g is no greater than 5; c and i each represent, independently, an integer of 1 or greater, j represents either 0 or an integer of 1 or greater, and c+i+j is no greater than 5; d represents an integer of 1 or greater, k and l each represent, independently, either 0 or an integer of 1 or greater, and d+k+l is no greater than 3].

3. A positive resist composition, comprising a base material component (A), which contains acid dissociable, dissolution inhibiting groups and displays increased alkali solubility under action of acid, and (B) an acid generator that generates acid on exposure, wherein
said base material component (A) is a base material for a pattern-forming material according to claim 1.

4. A positive resist composition, comprising a base material component (A), which contains acid dissociable, dissolution inhibiting groups and displays increased alkali solubility under action of acid, and (B) an acid generator that generates acid on exposure, wherein
said base material component (A) is a base material for a pattern-forming material according to claim 2.

5. A positive resist composition according to claim 3, further comprising a nitrogen-containing organic compound (D).

6. A method of forming a resist pattern comprising the steps of applying a positive resist composition according to claim 3 to a substrate, conducting a prebake, performing selective exposure, conducting PEB (post exposure baking), and performing alkali developing to form a resist pattern.

7. A method of forming a resist pattern comprising the steps of applying a positive resist composition according to claim 4 to a substrate, conducting a prebake, performing selective exposure, conducting PEB (post exposure baking), and performing alkali developing to form a resist pattern.

8. A base material for a pattern-forming material, comprising a protected material (Y1), which is formed from a polyhydric phenol compound (y) that comprises two or more phenolic hydroxyl groups and has a molecular weight within a range from 450 to 1,500, in which either a portion of, or all of, said phenolic hydroxyl groups are protected with acid dissociable, dissolution inhibiting groups, and wherein
the proportion within said base material of said protected material (Y1) is greater than 80% by weight, wherein the proportion within said base material of an unprotected material (Y2), in which said phenolic hydroxyl groups of said polyhydric phenol compound (y) are not protected with acid dissociable, dissolution inhibiting groups, is no more than 20% by weight.

9. A base material for a pattern-forming material according to claim 8, wherein a molecular weight dispersity (Mw/Mn) of said polyhydric phenol compound (y) is no more than 1.5.

10. A base material for a pattern-forming material according to claim 8, wherein said polyhydric phenol compound (y) is a compound represented by a general formula (I) shown below:

[Formula 4]

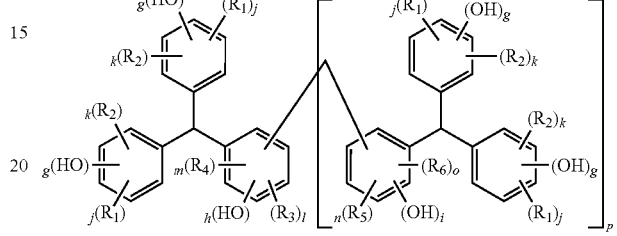

[wherein, $R_1$ through $R_6$ each represent, independently, an alkyl group or aromatic hydrocarbon group of 1 to 10 carbon atoms, and these structures may also include a hetero atom; g and j each represent, independently, an integer of 1 or greater, k represents either 0 or an integer of 1 or greater, and g+j+k is no greater than 5; h is an integer of 1 or greater, l and m each represent, independently, either 0 or an integer of 1 or greater, and h+l+m is no greater than 4; i is an integer of 1 or greater, n and o each represent, independently, either 0 or an integer of 1 or greater, and i+n+o is no greater than 4; and p is either 0 or 1].

11. A positive resist composition, comprising a base material component (A), which contains acid dissociable, dissolution inhibiting groups and displays increased alkali solubility under action of acid, and (B) an acid generator that generates acid on exposure, wherein
said base material component (A) is a base material for a pattern-forming material according to claim 8.

12. A positive resist composition, comprising a base material component (A), which contains acid dissociable, dissolution inhibiting groups and displays increased alkali solubility under action of acid, and (B) an acid generator that generates acid on exposure, wherein
said base material component (A) is a base material for a pattern-forming material according to claim 10.

13. A positive resist composition according to claim 11, further comprising a nitrogen-containing organic compound (D).

14. A method of forming a resist pattern comprising the steps of applying a positive resist composition according to claim 11 to a substrate, conducting a prebake, performing selective exposure, conducting PEB (post exposure baking), and performing alkali developing to form a resist pattern.

15. A method of forming a resist pattern comprising the steps of applying a positive resist composition according to claim 12 to a substrate, conducting a prebake, performing selective exposure, conducting PEB (post exposure baking), and performing alkali developing to form a resist pattern.

16. A base material for a pattern-forming material according to claim 1, wherein the proportion within said base material of said low molecular weight compound (X1), which is formed from a polyhydric phenol compound (x), wherein either a portion of, or all of, said phenolic hydroxyl groups are protected with acid dissociable, dissolution inhibiting groups, is 100% by weight.

17. A base material for a pattern-forming material according to claim 1, wherein the proportion of phenolic hydroxyl groups is within a range of from 5 to 50 mol %.

18. A base material for a pattern-forming material according to claim 8, wherein a proportion within said base material of said protected material (Y1) is 100% by weight.

19. A base material for a pattern-forming material according to claim 8, wherein the proportion of phenolic hydroxyl groups is within a range of from 5 to 50 mol %.

20. A base material for a pattern-forming material according to claim 1, comprising a low molecular weight compound (X1), which is formed from a polyhydric phenol compound (x) that comprises two or more phenolic hydroxyl groups and satisfies conditions (1), (2), and (3) described below, wherein either a portion of, or all of, said phenolic hydroxyl groups are protected with acid dissociable, dissolution inhibiting groups, wherein
the proportion within said base material of said low molecular weight compound (X1), in which either a portion of, or all of, said polyhydric phenol compound (x) is protected with acid dissociable, dissolution inhibiting groups, is greater than 80% by weight:
(1) a molecular weight within a range from 450 to 1,500,
(2) a molecular weight dispersity of no more than 1.5, and (3) an ability to form an amorphous film using a spin coating method,
wherein said polyhydric phenol compound (x) is one or more compounds selected from the group consisting of polyhydric phenol compounds represented by general formulas (I) shown below:

[Formula 1]

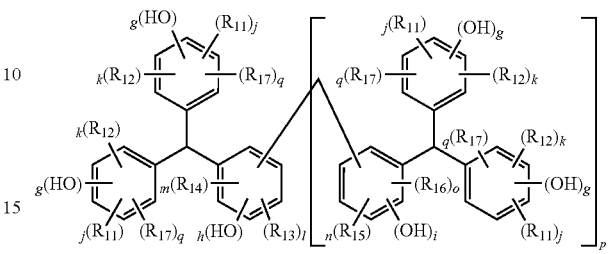

(I)

[wherein, $R_{11}$ through $R_{17}$ each represent, independently, an alkyl group or aromatic hydrocarbon group of 1 to 10 carbon atoms, and these structures may also include a hetero atom; g and j each represent, independently, an integer of 1 or greater, k and q each represent either 0 or an integer of 1 or greater, and g+j+k+q is no greater than 5; h is an integer of 1 or greater, 1 and m each represent, independently, either 0 or an integer of 1 or greater, and h+1+m is no greater than 4; i is an integer of 1 or greater, n and o each represent, independently, either 0 or an integer of 1 or greater, and i+n+o is no greater than 4; and p is 1].

* * * * *

UNITED STATES PATENT AND TRADEMARK OFFICE
CERTIFICATE OF CORRECTION

PATENT NO.         : 7,923,192 B2
APPLICATION NO.    : 10/590046
DATED              : April 12, 2011
INVENTOR(S)        : Taku Hirayama et al.

It is certified that error appears in the above-identified patent and that said Letters Patent is hereby corrected as shown below:

At Column 2, Line 56, Change "or. more" to --or more--.

At Column 4, Line 34-35, Change "3 ,4-dihydroxyphenylmethane," to --3,4-dihydroxyphenylmethane,--.

At Column 11, Line 27, Change "hydroxyphenylmethane,bis" to --hydroxyphenylmethane, bis--.

At Column 16, Line 2, Change "included" to --include α--.

At Column 17, Line 42, Change "cyclohekanone," to --cyclohexanone,--.

At Column 31 (Table 2), Line 4, Change "Example 1" to --Example 3--.

At Column 31 (Table 2), Line 5, Change "Example 2" to --Example 4--.

At Column 31 (Table 2), Line 7, Change "example 1" to --example 2--.

At Column 32, Line 35 (Approx.), In Claim 2, change "greater, 1" to --greater, l--.

At Column 32, Line 37 (Approx.), In Claim 2, change "h+1+m" to --h+l+m--.

At Column 32, Line 65, In Claim 2, change "greater, 1" to --greater, l--.

At Column 33, Line 26, In Claim 2, change "k and 1" to --k and l--.

At Column 33, Line 28, In Claim 2, change "d+k+1" to --d+k+l--.

At Column 34, Line 30, In Claim 10, change "greater, 1" to --greater, l--.

At Column 36, Line 24 (Approx.), In Claim 20, change "greater, 1" to --greater, l--.

At Column 36, Line 26, In Claim 20, change "h+1+m" to --h+l+m--.

Signed and Sealed this
Eleventh Day of October, 2011

David J. Kappos
*Director of the United States Patent and Trademark Office*